United States Patent
Doubchak et al.

(10) Patent No.: US 12,388,468 B2
(45) Date of Patent: Aug. 12, 2025

(54) GENERALIZED HIERARCHICAL CONCATENATED CODES WITH FIXED DIMENSION AND CODE LENGTH

(71) Applicant: SAMSUNG ELECTRONICS CO., LTD., Suwon-si (KR)

(72) Inventors: Ariel Doubchak, Herzliya (IL); Avner Dor, Kfar Saba (IL); Yaron Shany, Kfar Saba (IL); Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 97 days.

(21) Appl. No.: 18/231,554

(22) Filed: Aug. 8, 2023

(65) Prior Publication Data

US 2025/0055483 A1 Feb. 13, 2025

(51) Int. Cl.
*H03M 13/29* (2006.01)
*H03M 13/25* (2006.01)

(52) U.S. Cl.
CPC ......... *H03M 13/29* (2013.01); *H03M 13/253* (2013.01); *H03M 13/2936* (2013.01)

(58) Field of Classification Search
None
See application file for complete search history.

(56) References Cited

U.S. PATENT DOCUMENTS

| | | | |
|---|---|---|---|
| 11,031,956 B2 | 6/2021 | Berman et al. | |
| 11,387,848 B1* | 7/2022 | Berman | H03M 13/2906 |
| 11,581,906 B1 | 2/2023 | Berman et al. | |
| 2007/0043997 A1* | 2/2007 | Yang | H03M 13/2903 |
| | | | 714/758 |
| 2014/0331083 A1* | 11/2014 | Aliev | G06F 11/108 |
| | | | 714/6.23 |
| 2014/0380114 A1* | 12/2014 | Alexeev | H03M 13/2906 |
| | | | 714/755 |
| 2017/0331498 A1* | 11/2017 | Freudenberger | H03M 13/1505 |
| 2017/0331499 A1 | 11/2017 | Freudenberger et al. | |
| 2019/0158222 A1* | 5/2019 | Kurmaev | H03M 13/6362 |
| 2020/0412385 A1* | 12/2020 | Arikan | H04L 1/0041 |
| 2022/0103291 A1* | 3/2022 | Arikan | H04L 1/0064 |
| 2023/0208554 A1* | 6/2023 | Wang | H04L 1/0045 |
| | | | 370/329 |

OTHER PUBLICATIONS

J. Spinner and J. Freudenberger, "A decoder with soft decoding capability for high-rate generalized concatenated codes with applications in non-volatile flash memories," 2017 30th Symposium on Integrated Circuits and Systems Design (SBCCI), Fortaleza, Brazil, 2017.*

(Continued)

*Primary Examiner* — Steve N Nguyen
(74) *Attorney, Agent, or Firm* — Sughrue Mion, PLLC

(57) ABSTRACT

Systems, devices, and methods for encoding information bits for storage, including obtaining information bits; encoding the information bits using an inner code to obtain a plurality of inner code words; encoding the plurality of inner code words using an outer code to generate an outer code word; and storing the outer code word in a storage device, wherein at least one of the inner code and the outer code includes a generalized concatenated code (GCC), and wherein the outer code word includes a hierarchical-GCC (H-GCC) code word.

17 Claims, 31 Drawing Sheets

(56) References Cited

OTHER PUBLICATIONS

P. Trifonov and P. Semenov, "Generalized concatenated codes based on polar codes," 2011 8th International Symposium on Wireless Communication Systems, Aachen, Germany, 2011.*

Peter Trifonov, "Efficient Design and Decoding of Polar Codes", IEEE Transactions on Communications, vol. 60, No. 11, Nov. 2012, pp. 3221-3227, DOI: 10.1109/TCOMM.2012.081512.110872.

Thomas Mittelholzer et al., "High-Throughput ECC with Integrated Chipkill Protection for Nonvolatile Memory Arrays", 2021 IEEE International Symposium on Circuits and Systems (ISCAS), 5 pages, DOI: 10.1109/ISCAS51556.2021.9401752.

Erdal Arkan., "Channel Polarization: A Method for Constructing Capacity-Achieving Codes for Symmetric Binary-Input Memoryless Channels", IEEE Transactions on Information Theory, vol. 55, No. 7, Jul. 2009, 23 pages.

Gabi Sarkis et al., "Flexible and low-complexity encoding and decoding of systematic polar codes", IEEE Transactions on Communications, arXiv:1507.03614, 2016, 14 pages.

Peter Trifonov et al., "Polar subcodes", IEEE JSAC special issue on Recent Advances In Capacity Approaching Codes, arXiv:1511. 01646 [cs.IT], IEEE Journal on Selected Areas in Communications, vol. 34, No. 2, Feb. 2016, 13 pages.

* cited by examiner

FIG. 12A

```
Algorithm 1
Input:
Code parameters: $GCC(L, M, n, n - k_i, \{F_r\}_{r=1}^M, P(n, k_{0 \to M}, \phi_0^{q-M}))$
Information bits: $in$ where $|in| = \sum_{i=1}^{L}(n - k_i)$
Initiation:
q = 0    # RS code pointer
c = 0    # Information bits pointer
Algorithm:
for i=1:L
        Set $r_i = in_{c+1}^{c+k_i}$ the frame information bits $|r_i| = k_i$ frame information bits
        $c += k_i$
        Set $u_{\phi_0} = 0$
        Set $u_{\phi_t} = s_{i,t}$ $\forall t \in [q]$
        Step a: Encode polar word with coset: $c_i = ENC_{Polar}(i_i, u_{\phi_0^q})$
        Step b: Update polar transform space: $s_i = P \cdot c_i$
        if $i = L$
                return
        If $k_{i+1} \neq k_i$
                while True
                        q++
                        Step c: Encoder RS code word: $\{s_{j,q}\}_{j=1}^{L} = ENC_{RS}(\{s_{j,q}\}_{j=1}^{i}, F_q)$
                        if $q = M_1$ or $F_{q+1} < F_q$
                                break
Output
GCC code word $w = \{c_i\}_{i=1}^{L}$
```

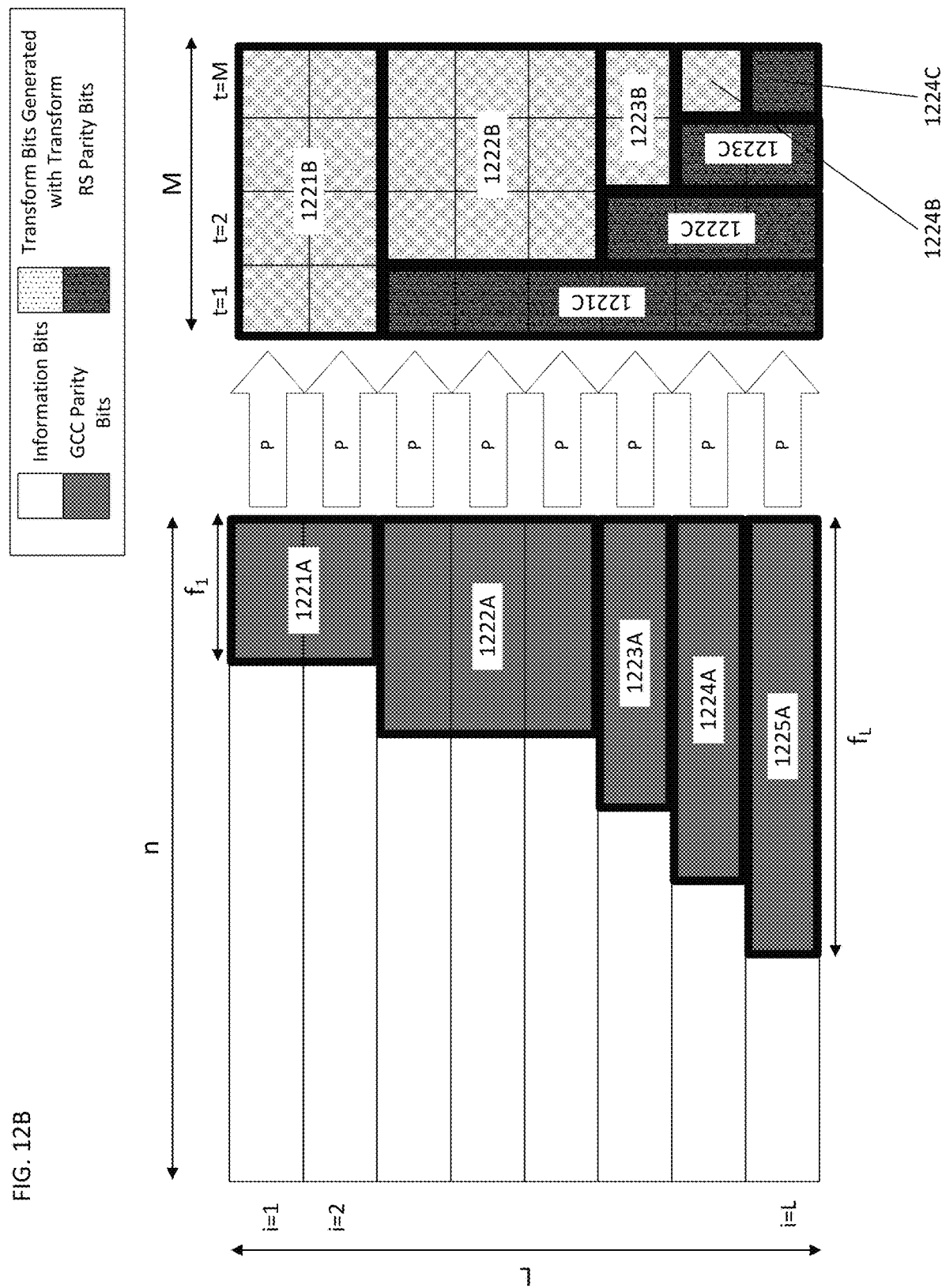

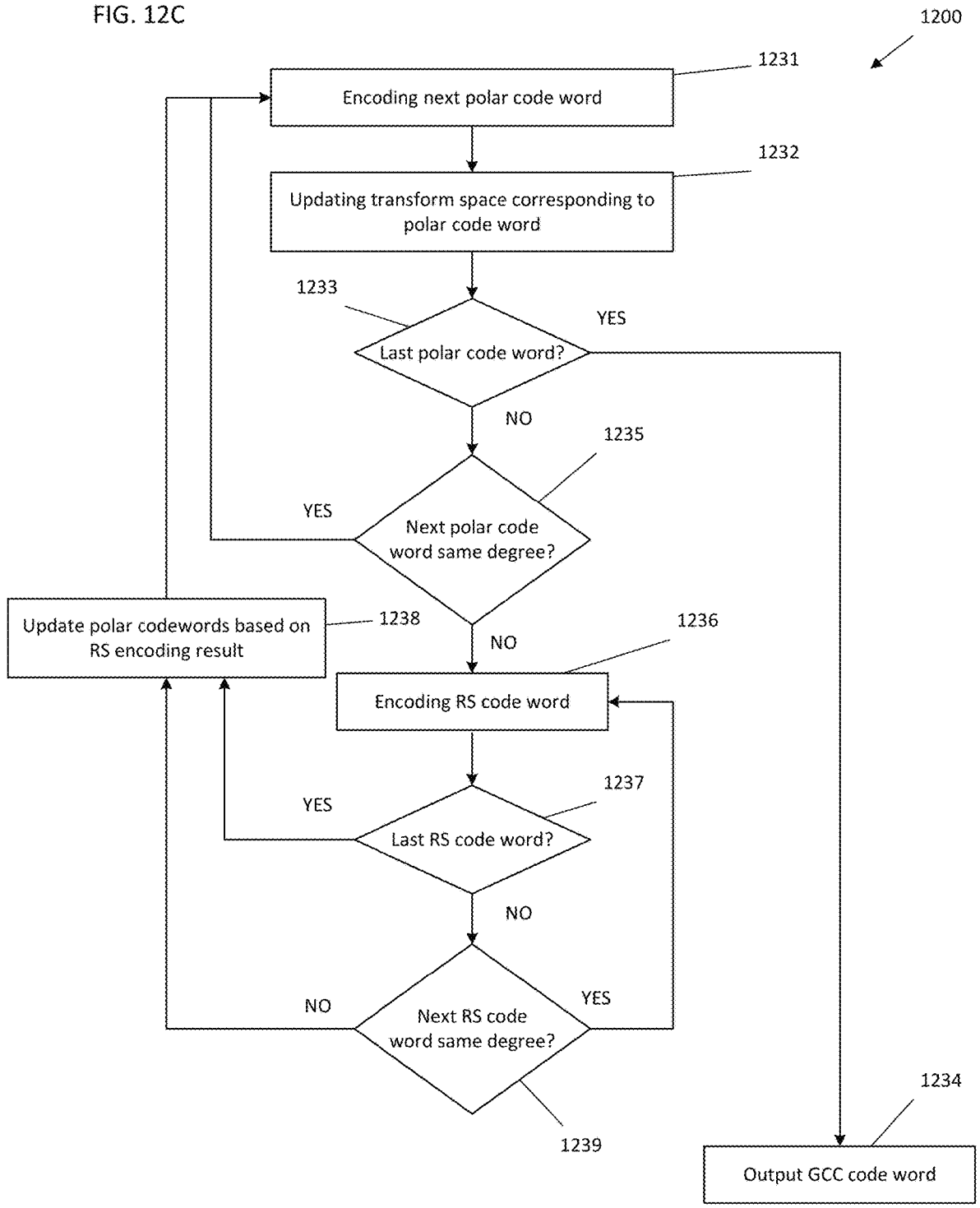

FIG. 20A

```
Algorithm 2

Input:
in – a $L_2 \cdot K$ information bits vector.

Initialization:
t = 0  # S – RS index pointer
k = 0  # information bit pointer
$i_p$ = 0 $\forall p \in [L_2]$  # index of frame of GCC code word p
$\{s_{i,w}^p\}$ = 0 $\forall i \in [L_1], p \in [L_2], w \in [M_2]$  # transform space Algorithm:
while $k < K \cdot L_2$
    for p = 1:$L_2$
        while $i_p < L_2 - \hat{F}_t^p$
            $i_p$ + +  # update code frame pointer
            info = in[k + 1: k + $\hat{k}_t^p$]  # get information bits
            Step a: $c_t^p$ = polar encoder$(info, \{s_{t,w}^p\}_{w=1..r})$  # polar coset encoder
            Step b: $\{s_{t,w}^p\}_{w=1..M_t}$ = $P \cdot c_t^p$  # update transform space
            k + = $\hat{k}_t^p$  # update info pointer
    t + +  # update S-RS pointer
    Step c: $\{s_{t,i}^p\}_{i=1..L_1}^{p=1..L_2}$ = SRS encoder$\left(\{s_{t,i}^{w_t(p)}\}_{i=1..L_1}^{p=1..L_2}\right)$  # SRS encoder (including row permutation)

Output:
$c_i^p$, $\forall i \in [L_1], p \in [L_2]$ · H-GCC code word ($|c_i^p| = n$)
```

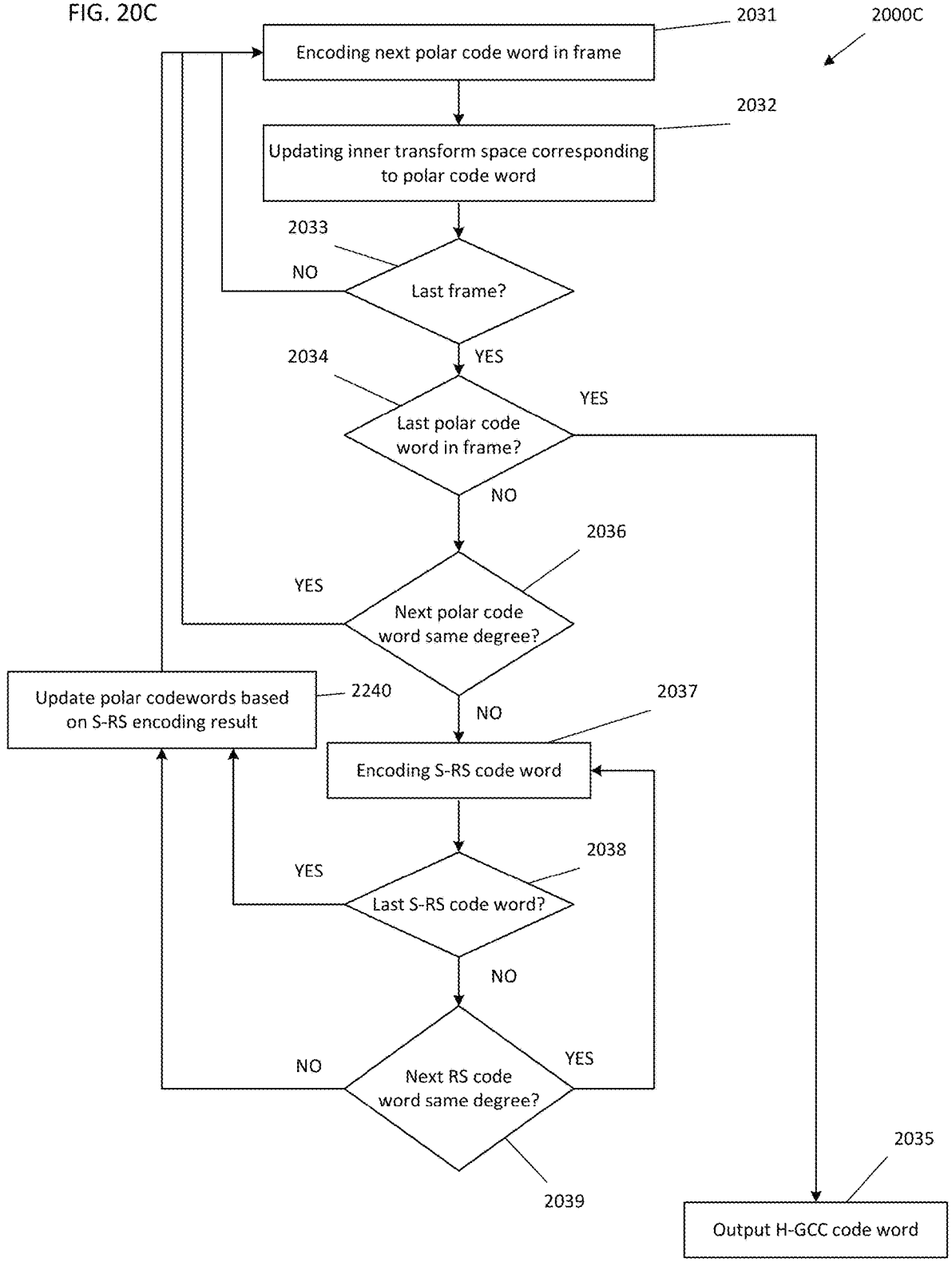

GENERALIZED HIERARCHICAL CONCATENATED CODES WITH FIXED DIMENSION AND CODE LENGTH

BACKGROUND

1. Field

Apparatuses and methods consistent with embodiments relate to managing a storage device, more particularly error correction coding using generalized hierarchical concatenated codes.

2. Description of Related Art

In general, a NAND chip, which may be used for example in flash memory devices, may have a structure which includes blocks of word lines (WLs), where each WL includes bit lines (BLs). A NAND cell may be formed at the intersection of a WL and a BL.

To allow fast NAND access, each WL may be broken up into RAUs (random access units). To allow high reliability access, each RAU is protected with an Error Correction Code (ECC). The ECC code length may have a particular length, and may accommodate a particular number of information bits. In ECC, longer codes may achieve better reliability, and there is motivation to have longer ECCs. On the other hand, the RAU structure may limit the length of ECC codes to a particular length.

Therefore, there is a need for a coding scheme which maintains and improves reading speed and decoding time using local ECC for each RAU, while also achieving improved reliability associated with longer code rates.

SUMMARY

In accordance with an aspect of the disclosure, a storage system includes a storage device configured to store a plurality of code words; at least one processor configured to: obtain information bits; encode the information bits using an inner code to obtain a plurality of inner code words; encode the plurality of inner code words using an outer code to generate an outer code word; store the outer code word in the storage device, wherein at least one of the inner code and the outer code comprises a generalized concatenated code (GCC), and wherein the outer code word comprises a hierarchical-GCC (H-GCC) code word.

In accordance with an aspect of the disclosure, a device for encoding information bits for storage in a storage device includes a memory interface configured to communicate with the storage device; and at least one processor configured to: obtain information bits; encode the information bits using a polar code to obtain a plurality of polar code words; encode the plurality of polar code words using a generalized concatenated code (GCC) to obtain a hierarchical-GCC (H-GCC) code word, wherein constituent codes of the GCC code comprise a first Reed-Solomon (RS) code and a second RS code; and control the memory interface to transmit the H-GCC code word to the storage device.

In accordance with an aspect of the disclosure, a method of controlling a storage system, is executed by at least one processor and includes obtaining information bits; encoding the information bits using an inner code to obtain a plurality of inner code words; encoding the plurality of inner code words using an outer code to generate an outer code word; and storing the outer code word in a storage device, wherein at least one of the inner code and the outer code comprises a generalized concatenated code (GCC), and wherein the outer code word comprises a hierarchical-GCC (H-GCC) code word.

In accordance with an aspect of the disclosure, a method of encoding information bits for storage in a storage device is executed by at least one processor and includes obtaining information bits; encoding the information bits using a polar code to obtain a plurality of polar code words; encoding the plurality of polar code words using a generalized concatenated code (GCC) to obtain a hierarchical-GCC (H-GCC) code word, wherein constituent codes of the GCC code comprise a first Reed-Solomon (RS) code and a second RS code; and transmitting the H-GCC code word to the storage device.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 12A illustrates an example of a sequential encoding algorithm which may be used to perform GCC encoding, according to embodiments;

FIG. 12B illustrates an example encoding order, according to embodiments;

FIG. 12C is a flowchart of an encoding process, according to embodiments;

FIG. 20A illustrates an example of a sequential encoding algorithm which may be used to perform H-GCC encoding, according to embodiments;

FIG. 20C is a flowchart of an encoding process;

DETAILED DESCRIPTION

In flash memories, data may be stored and read at a granularity of Random Access Unit (RAU). An error correction code (ECC) may be applied on the RAU data to provide fast read with high reliability. The RAU may include a predetermined number of information bits, while the NAND structure and the hardware architecture may limit the number of coded bits. Therefore, this structure may define a constraint on the number of information bits K, and the code length N.

ECC codes may provide higher gain for larger code length, and therefore there may be an advantage to increased code length despite the RAU constraints, in order to allow to RAUs to be read at high throughput and low complexity.

Accordingly, embodiments of the present disclosure may relate to a hierarchical ECC code which includes two hierarchies, and which may be referred to as a hierarchical generalized concatenated code (H-GCC). In embodiments, the first hierarchy of the H-GCC may protect a RAU with a fixed number of information bits K, and a fixed length N, using a generalized concatenated code (GCC), and local $P_L$ parity bits. The second hierarchy of the H-GCC may include a GCC which uses the first hierarchy as constituent codes, and inserts additional $P_G$ global parity bits per RAU.

An H-GCC according to embodiments may allow a RAU to be decoded with high throughput and fixed information and code length, thereby achieving relatively high throughput, while the second hierarchy provides coding gain from the longer effective code length.

Embodiments discussed below may relate to various constructions of an H-GCC code structure, and various methods of performing systematic encoding using H-GCC encoding algorithms. According to embodiments, the constituent codes and the code parameters of the H-GCC codes discussed herein may be selected according to different targets, for example correctability, complexity, power, etc.

Figure 1:
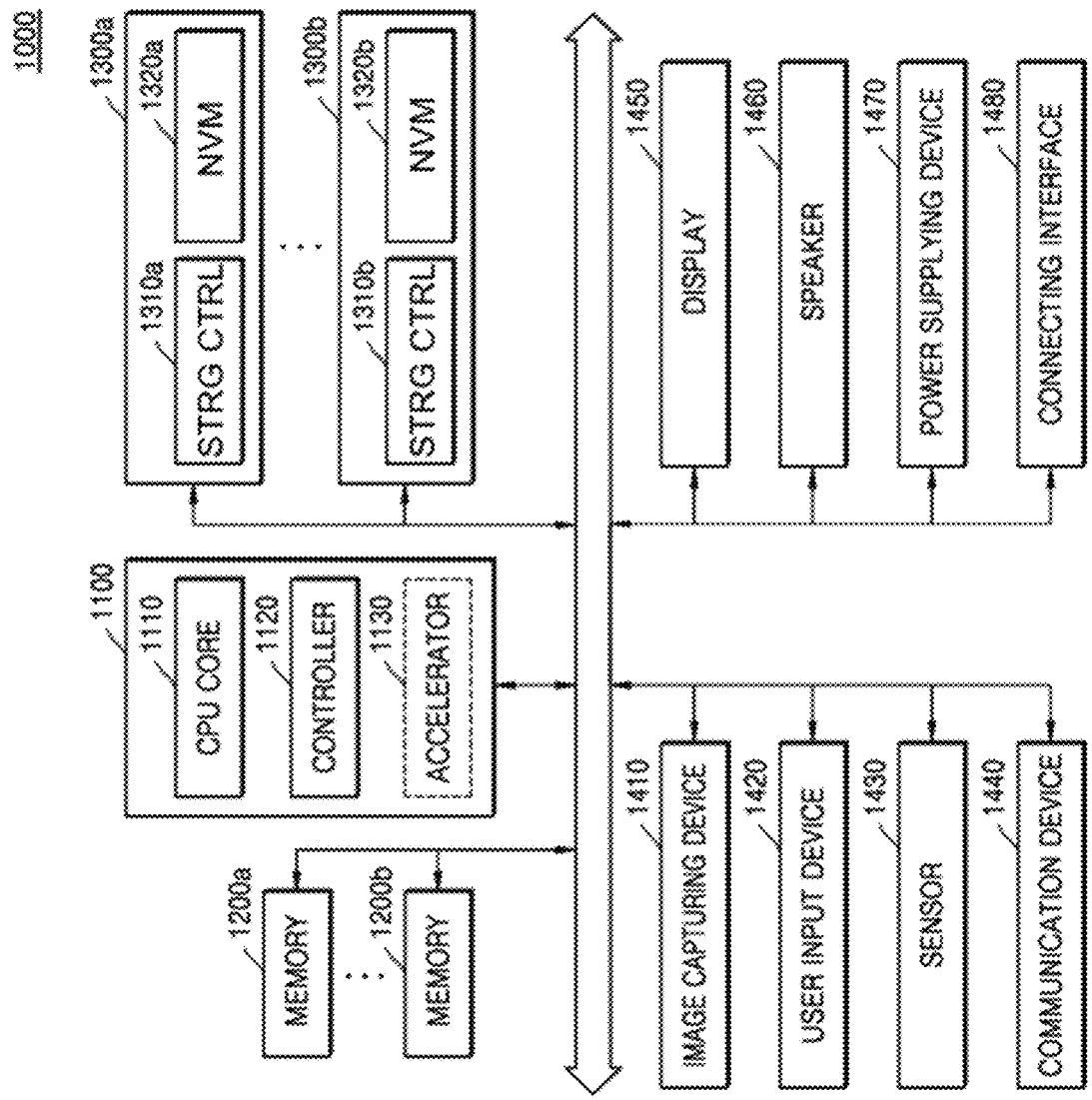
FIG. 1 is a block diagram of a computer system, according to embodiments.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a health-care device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of SSDs or memory cards, and may be removably combined with other components of the system 1000 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
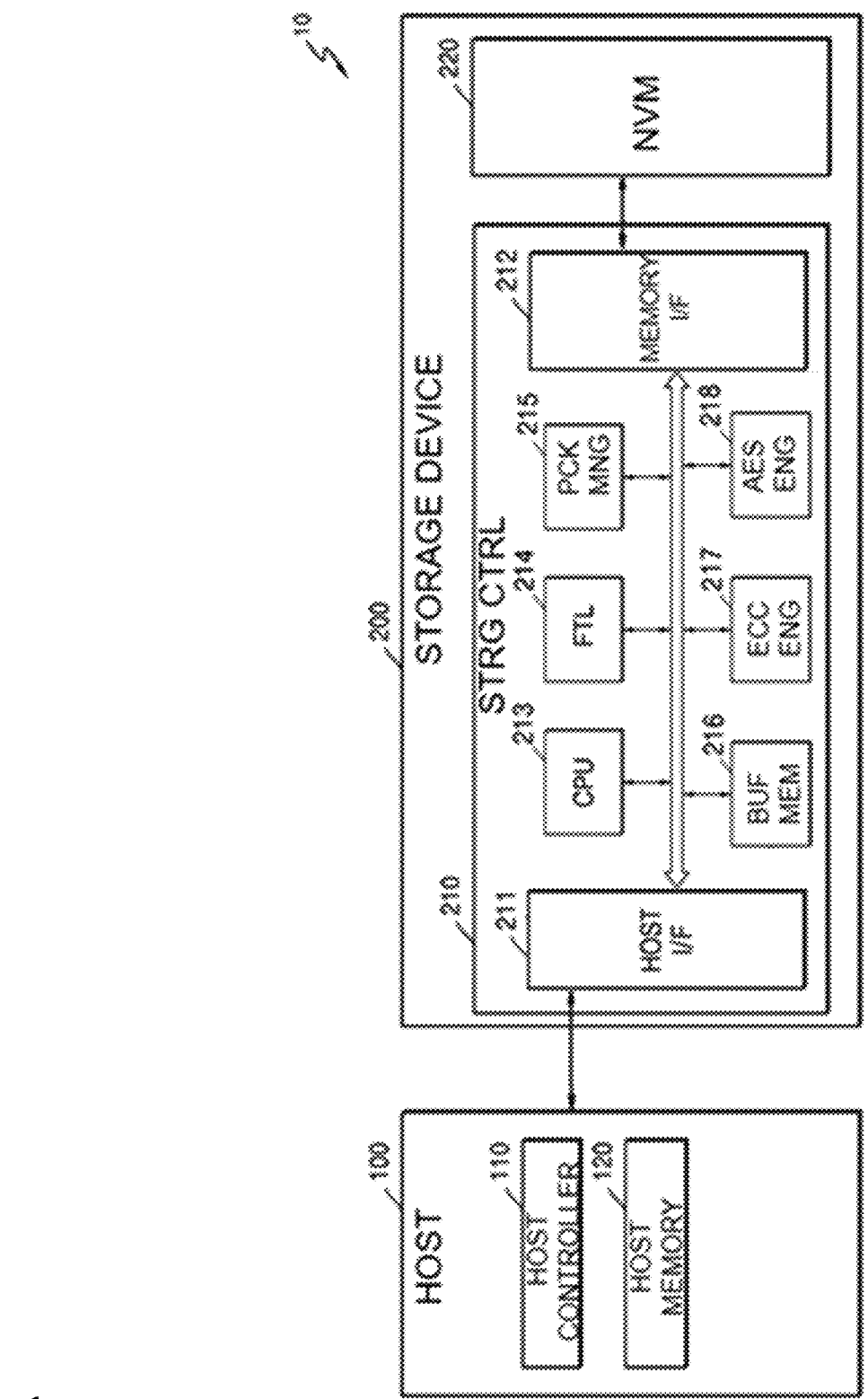
FIG. 2A is a block diagram of a host storage system, according to embodiments.

FIG. 2A is a block diagram of a host storage system 10 according to an example embodiment.

The host storage system 10 may include a host 100 and a storage device 200. Further, the storage device 200 may include a storage controller 210 and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an ECC engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 2B:
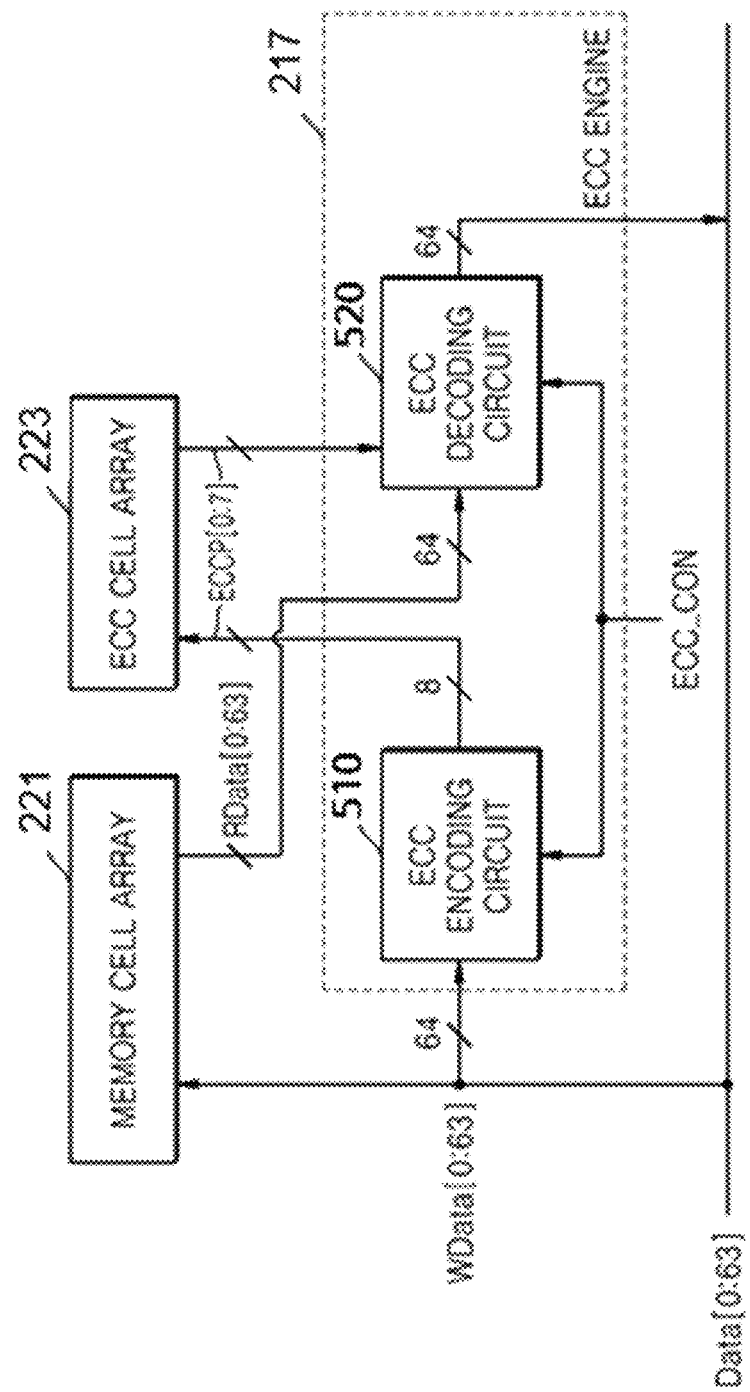
FIG. 2B is a block diagram of an ECC engine, according to embodiments.

FIG. 2B is a detailed diagram of the ECC engine 217 of FIG. 2A. Referring to FIG. 2B, the ECC engine 217 may include an ECC encoding circuit 510 and an ECC decoding circuit 520. In response to an ECC control signal ECC_CON, the ECC encoding circuit 510 may generate parity bits ECCP[0:7] for write data WData[0:63] to be written to memory cells of a memory cell array 221. The parity bits ECCP[0:7] may be stored in an ECC cell array 223. According to embodiments, in response to the ECC control signal ECC_CON, the ECC encoding circuit 510 may generate parity bits ECCP[0:7] for write data WData[0:63] to be written to memory cells including a defective cell of the memory cell array 221.

In response to the ECC control signal ECC_CON, the ECC decoding circuit 520 may correct error bit data by using read data RData[0:63] read from the memory cells of the memory cell array 221 and parity bits ECCP[0:7] read from the ECC cell array 223 and output error-corrected data Data[0:63]. According to embodiments, in response to the ECC control signal ECC_CON, the ECC decoding circuit 520 may correct error bit data by using read data RData[0:63] read from memory cells including a defective cell of the memory cell array 221 and parity bits ECCP[0:7] read from the ECC cell array 223, and output error-corrected data Data[0:63].

Figure 2C:
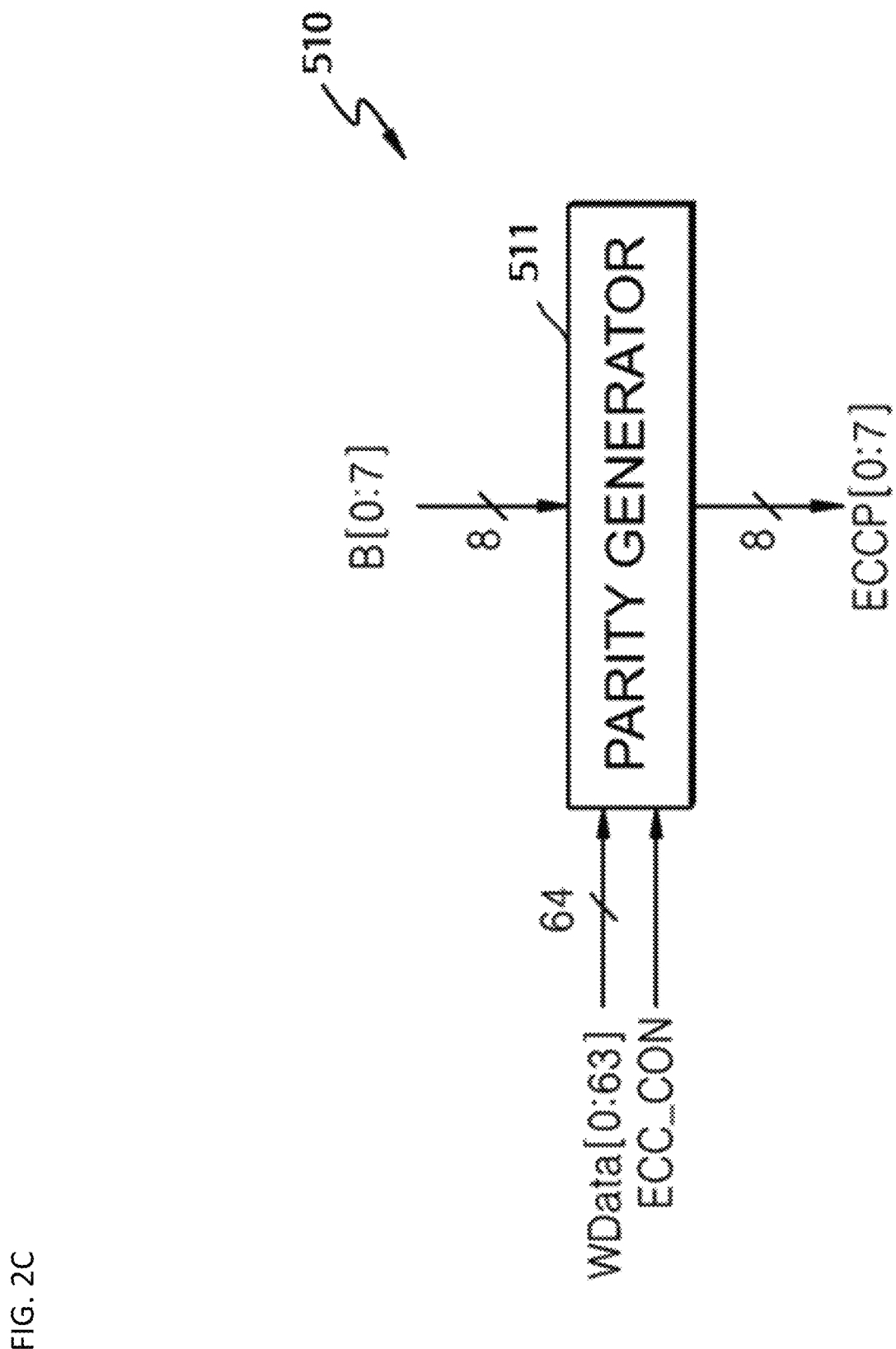
FIG. 2C is a block diagram of an ECC encoding circuit, according to embodiments.

FIG. 2C is a diagram of the ECC encoding circuit 510 of FIG. 2B.

Referring to FIG. 2C, the ECC encoding circuit 510 may include a parity generator 511, which receives 64-bit write data WData[0:63] and basis bits B[0:7] in response to an ECC control signal ECC_CON and generates parity bits ECCP[0:7] by using an XOR array operation. The basis bits B[0:7] may be bits for generating parity bits ECCP[0:7] for 64-bit write data WData[0:63], for example, b'00000000 bits. The basis bits B[0:7] may use other specific bits instead of b'00000000 bits.

Figure 3:
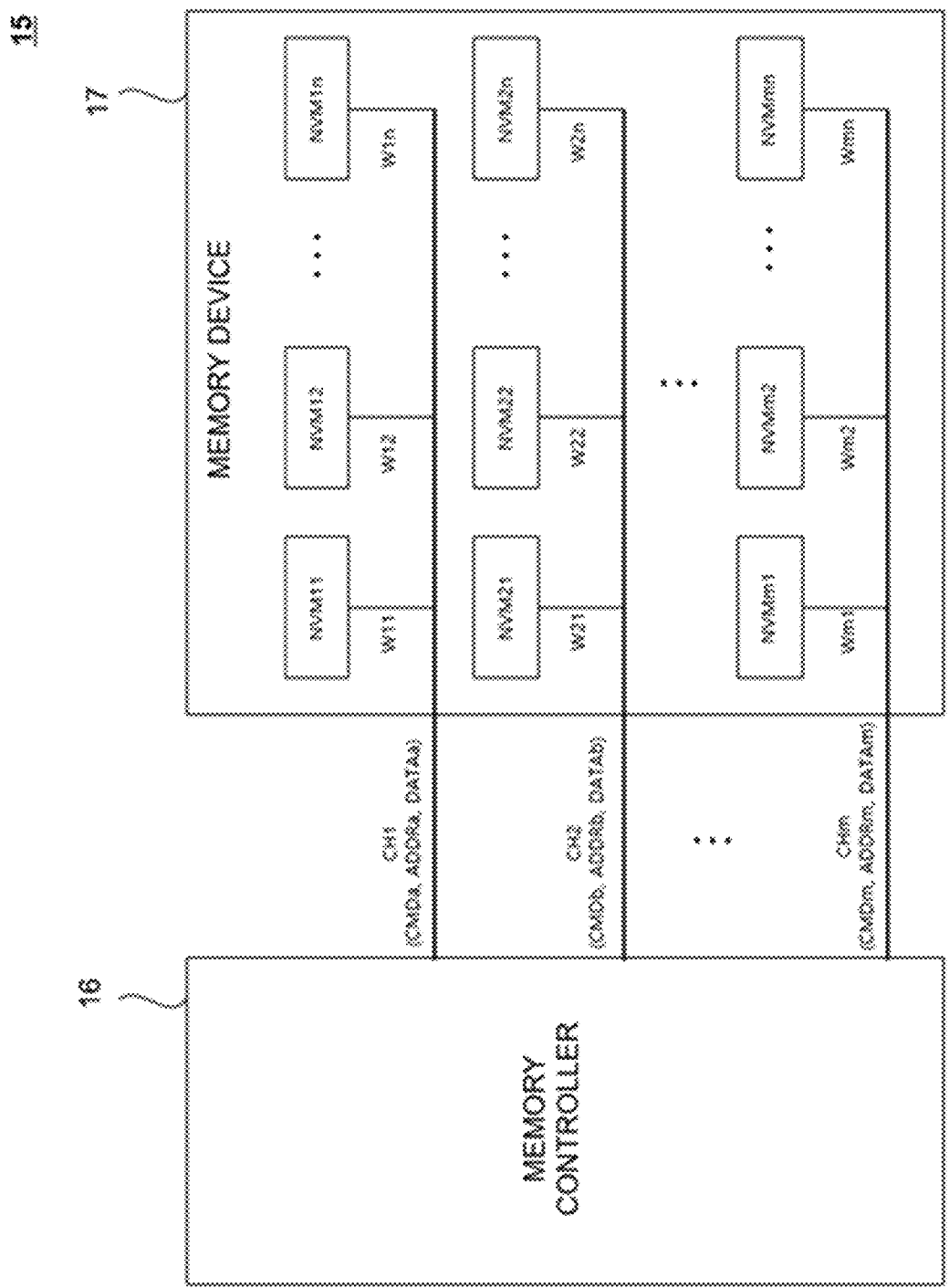
FIG. 3 is a block diagram of a memory system, according to embodiments.

FIG. 3 is a block diagram of a memory system 15 according embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1n may be connected to a first channel CH1 through ways W11 to W1n, and the NVM devices NVM21 to NVM2n may be connected to a second channel CH2 through ways W21 to W2n. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1n connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVM1n.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
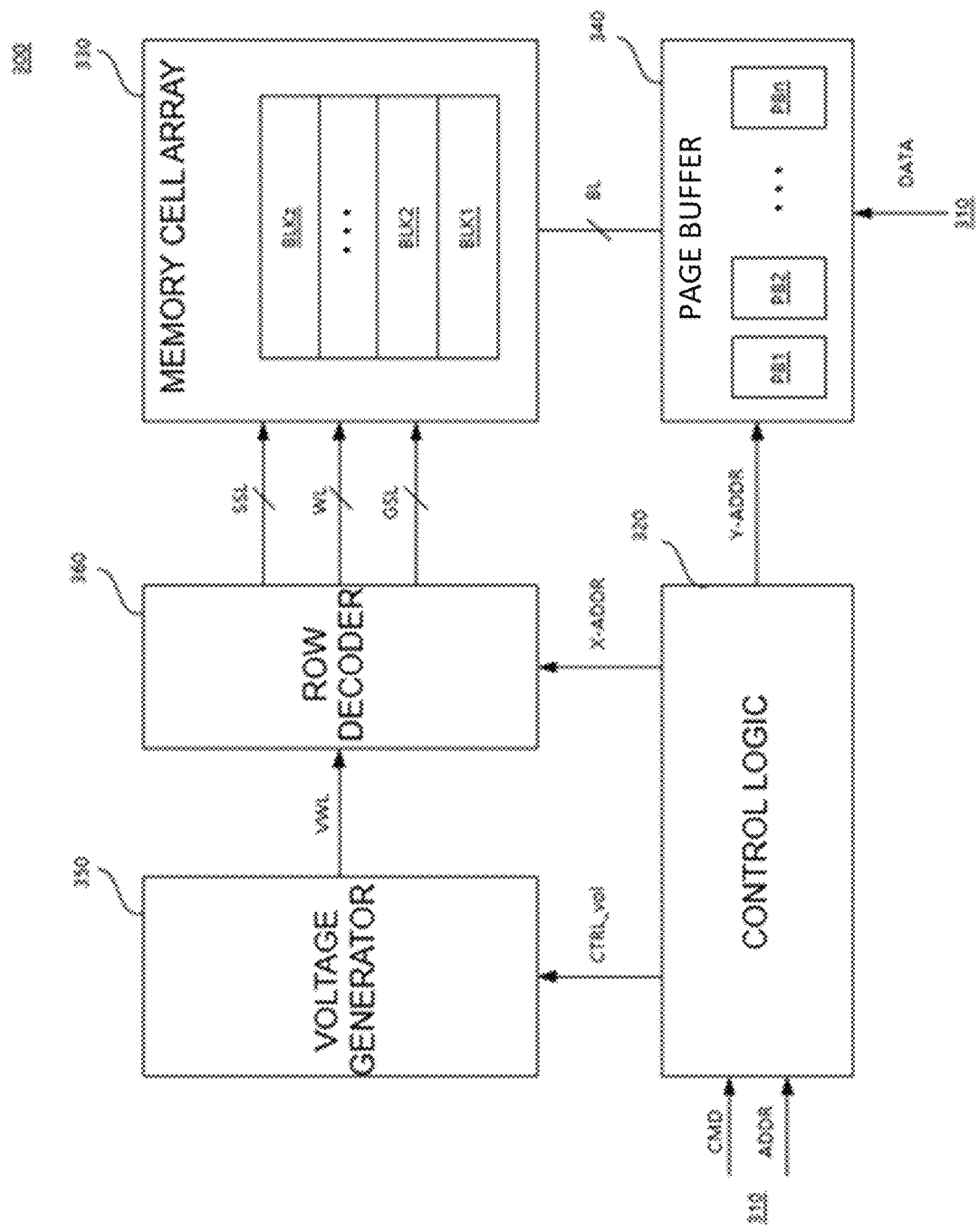
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
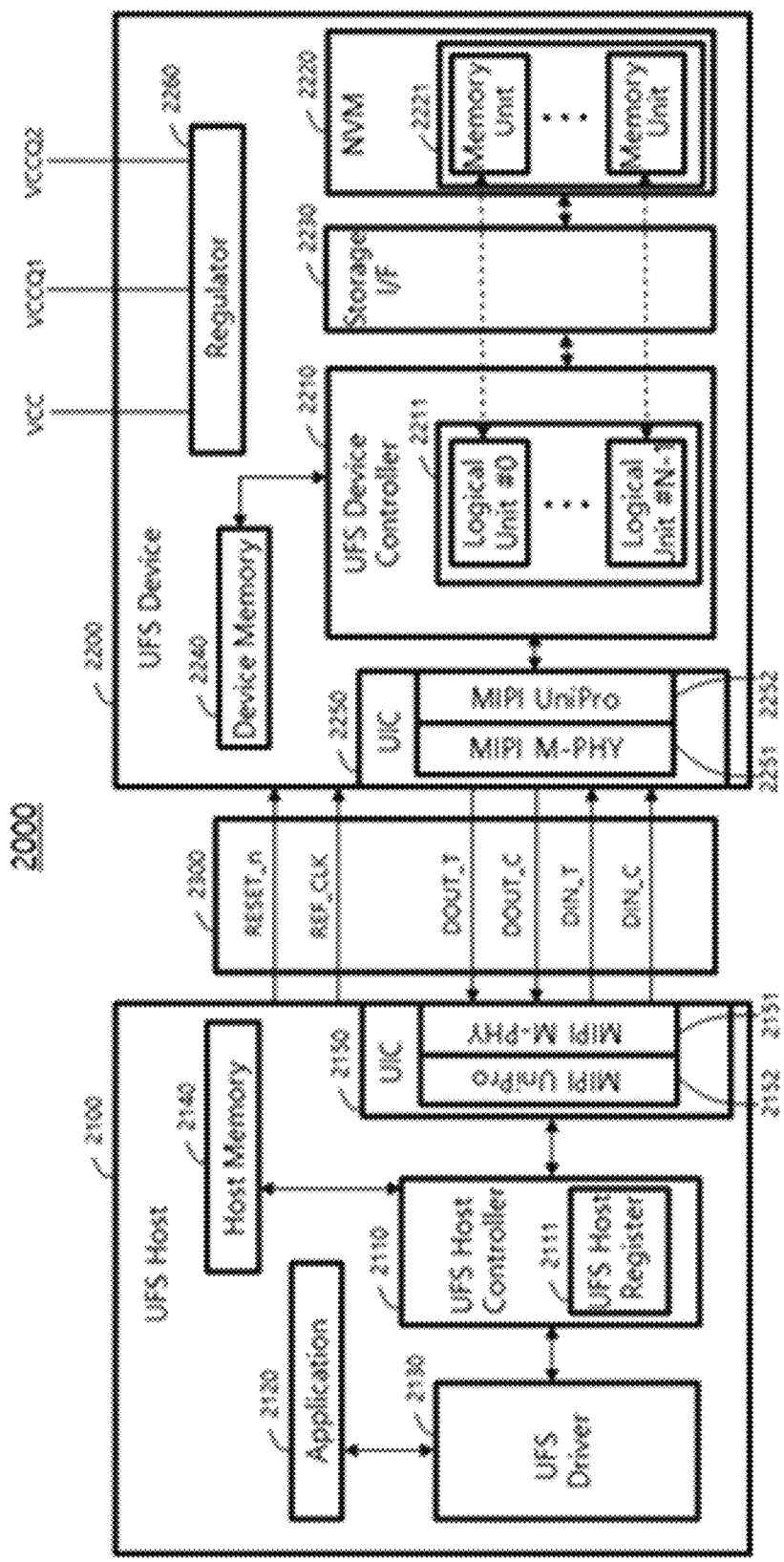
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1310a and 1310b and the NVMs 1320a and 1320b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

Figure 6:
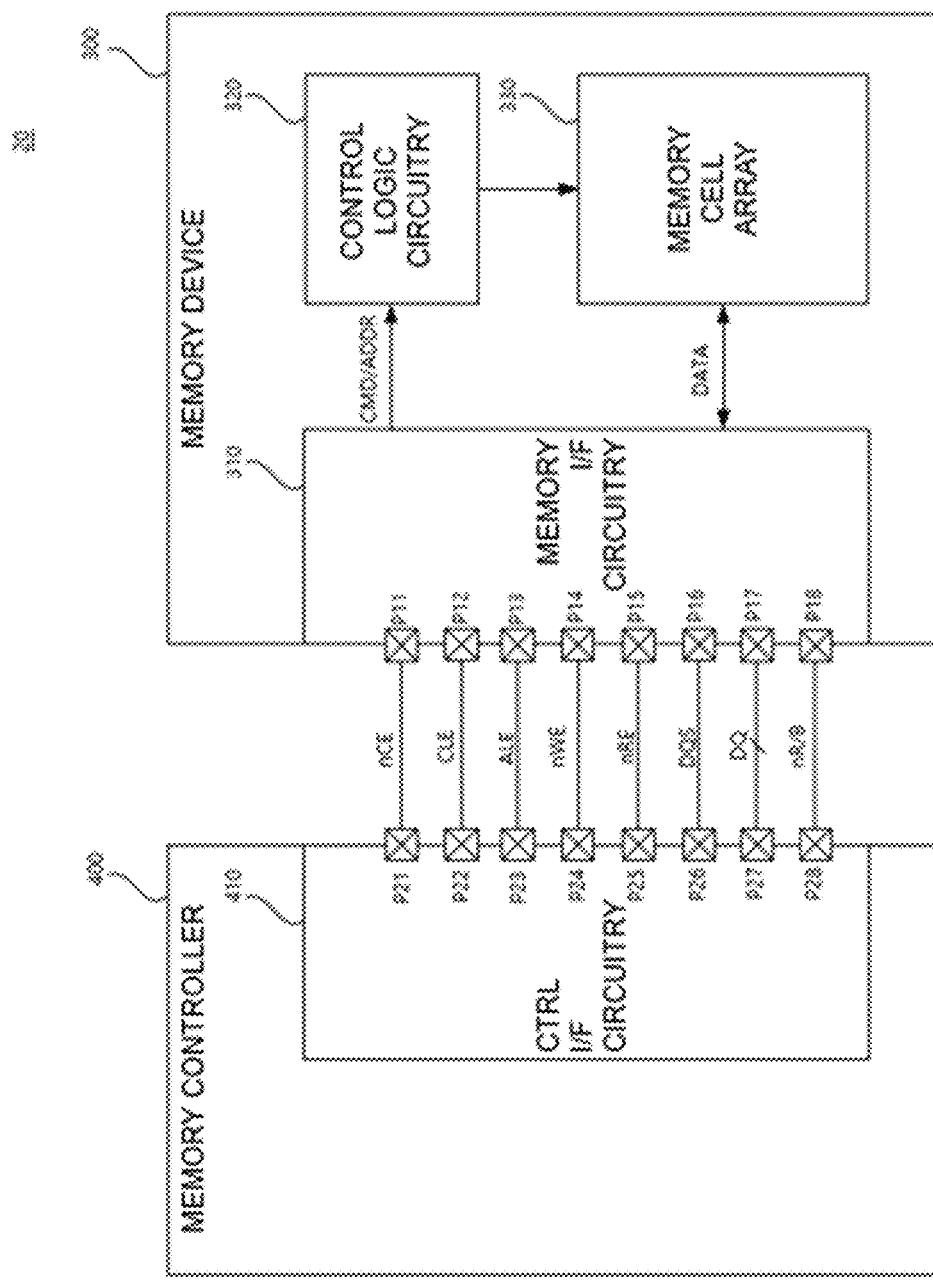
FIG. 6 is a block diagram of a memory system according to embodiments.

FIG. 6 is a block diagram of a memory system 20 according to an embodiment. Referring to FIG. 6, the memory system 20 may include a memory device 300 and a memory controller 400. The memory device 300 may correspond to one of NVM devices NVM11 to NVMmn, which communicate with a memory controller 400 based on one of the plurality of channels CH1 to CHm of FIG. 3. The memory controller 400 may correspond to the storage controller 210 of FIG. 2A.

The memory device 300 may include first to eighth pins P11 to P18, a memory interface circuitry 310, a control logic circuitry 320, and a memory cell array 330.

The memory interface circuitry 310 may receive a chip enable signal nCE from the memory controller 400 through the first pin P11. The memory interface circuitry 310 may transmit and receive signals to and from the memory controller 400 through the second to eighth pins P12 to P18 in response to the chip enable signal nCE. For example, when the chip enable signal nCE is in an enable state (e.g., a low level), the memory interface circuitry 310 may transmit and receive signals to and from the memory controller 400 through the second to eighth pins P12 to P18.

The memory interface circuitry 310 may receive a command latch enable signal CLE, an address latch enable signal ALE, and a write enable signal nWE from the memory controller 400 through the second to fourth pins P12 to P14. The memory interface circuitry 310 may receive a data signal DQ from the memory controller 400 through the seventh pin P17 or transmit the data signal DQ to the memory controller 400. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 310 may obtain the command CMD from the data signal DQ, which is received in an enable section (e.g., a high-level state) of the command latch enable signal CLE based on toggle time points of the write enable signal nWE. The memory interface circuitry 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 310 may obtain the command CMD or the address ADDR based on toggle time points of the write enable signal nWE.

The memory interface circuitry 310 may receive a read enable signal nRE from the memory controller 400 through the fifth pin P15. The memory interface circuitry 310 may receive a data strobe signal DQS from the memory controller 400 through the sixth pin P16 or transmit the data strobe signal DQS to the memory controller 400.

In a data (DATA) output operation of the memory device 300, the memory interface circuitry 310 may receive the read enable signal nRE, which toggles through the fifth pin P15, before outputting the data DATA. The memory interface circuitry 310 may generate the data strobe signal DQS, which toggles based on the toggling of the read enable signal nRE. For example, the memory interface circuitry 310 may generate a data strobe signal DQS, which starts toggling after a predetermined delay (e.g., tDQSRE), based on a toggling start time of the read enable signal nRE. The memory interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 400.

In a data (DATA) input operation of the memory device 300, when the data signal DQ including the data DATA is received from the memory controller 400, the memory interface circuitry 310 may receive the data strobe signal DQS, which toggles, along with the data DATA from the memory controller 400. The memory interface circuitry 310 may obtain the data DATA from the data signal DQ based on toggle time points of the data strobe signal DQS. For example, the memory interface circuitry 310 may sample the data signal DQ at rising and falling edges of the data strobe signal DQS and obtain the data DATA.

The memory interface circuitry 310 may transmit a ready/busy output signal nR/B to the memory controller 400 through the eighth pin P18. The memory interface circuitry 310 may transmit state information of the memory device 300 through the ready/busy output signal nR/B to the memory controller 400. When the memory device 300 is in a busy state (i.e., when operations are being performed in the memory device 300), the memory interface circuitry 310 may transmit a ready/busy output signal nR/B indicating the busy state to the memory controller 400. When the memory device 300 is in a ready state (i.e., when operations are not performed or completed in the memory device 300), the memory interface circuitry 310 may transmit a ready/busy output signal nR/B indicating the ready state to the memory controller 400. For example, while the memory device 300 is reading data DATA from the memory cell array 330 in response to a page read command, the memory interface circuitry 310 may transmit a ready/busy output signal nR/B indicating a busy state (e.g., a low level) to the memory controller 400. For example, while the memory device 300 is programming data DATA to the memory cell array 330 in response to a program command, the memory interface circuitry 310 may transmit a ready/busy output signal nR/B indicating the busy state to the memory controller 400.

The control logic circuitry 320 may control all operations of the memory device 300. The control logic circuitry 320 may receive the command/address CMD/ADDR obtained from the memory interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the memory interface circuitry 310, via the control of the control logic circuitry 320. The memory cell array 330 may output the stored data DATA to the memory interface circuitry 310 via the control of the control logic circuitry 320.

The memory cell array 330 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 400 may include first to eighth pins P21 to P28 and a controller interface circuitry 410. The first to eighth pins P21 to P28 may respectively correspond to the first to eighth pins P11 to P18 of the memory device 300.

The controller interface circuitry 410 may transmit a chip enable signal nCE to the memory device 300 through the first pin P21. The controller interface circuitry 410 may transmit and receive signals to and from the memory device 300, which is selected by the chip enable signal nCE, through the second to eighth pins P22 to P28.

The controller interface circuitry 410 may transmit the command latch enable signal CLE, the address latch enable signal ALE, and the write enable signal nWE to the memory device 300 through the second to fourth pins P22 to P24. The controller interface circuitry 410 may transmit or receive the data signal DQ to and from the memory device 300 through the seventh pin P27.

The controller interface circuitry 410 may transmit the data signal DQ including the command CMD or the address ADDR to the memory device 300 along with the write enable signal nWE, which toggles. The controller interface circuitry 410 may transmit the data signal DQ including the command CMD to the memory device 300 by transmitting a command latch enable signal CLE having an enable state. Also, the controller interface circuitry 410 may transmit the data signal DQ including the address ADDR to the memory device 300 by transmitting an address latch enable signal ALE having an enable state.

The controller interface circuitry 410 may transmit the read enable signal nRE to the memory device 300 through the fifth pin P25. The controller interface circuitry 410 may receive or transmit the data strobe signal DQS from or to the memory device 300 through the sixth pin P26.

In a data (DATA) output operation of the memory device 300, the controller interface circuitry 410 may generate a read enable signal nRE, which toggles, and transmit the read enable signal nRE to the memory device 300. For example, before outputting data DATA, the controller interface circuitry 410 may generate a read enable signal nRE, which is changed from a static state (e.g., a high level or a low level) to a toggling state. Thus, the memory device 300 may generate a data strobe signal DQS, which toggles, based on the read enable signal nRE. The controller interface circuitry 410 may receive the data signal DQ including the data DATA along with the data strobe signal DQS, which toggles, from the memory device 300. The controller interface circuitry 410 may obtain the data DATA from the data signal DQ based on a toggle time point of the data strobe signal DQS.

In a data (DATA) input operation of the memory device 300, the controller interface circuitry 410 may generate a data strobe signal DQS, which toggles. For example, before transmitting data DATA, the controller interface circuitry 410 may generate a data strobe signal DQS, which is changed from a static state (e.g., a high level or a low level) to a toggling state. The controller interface circuitry 410 may transmit the data signal DQ including the data DATA to the memory device 300 based on toggle time points of the data strobe signal DQS.

The controller interface circuitry 410 may receive a ready/busy output signal nR/B from the memory device 300 through the eighth pin P28. The controller interface circuitry 410 may determine state information of the memory device 300 based on the ready/busy output signal nR/B.

Figure 7:
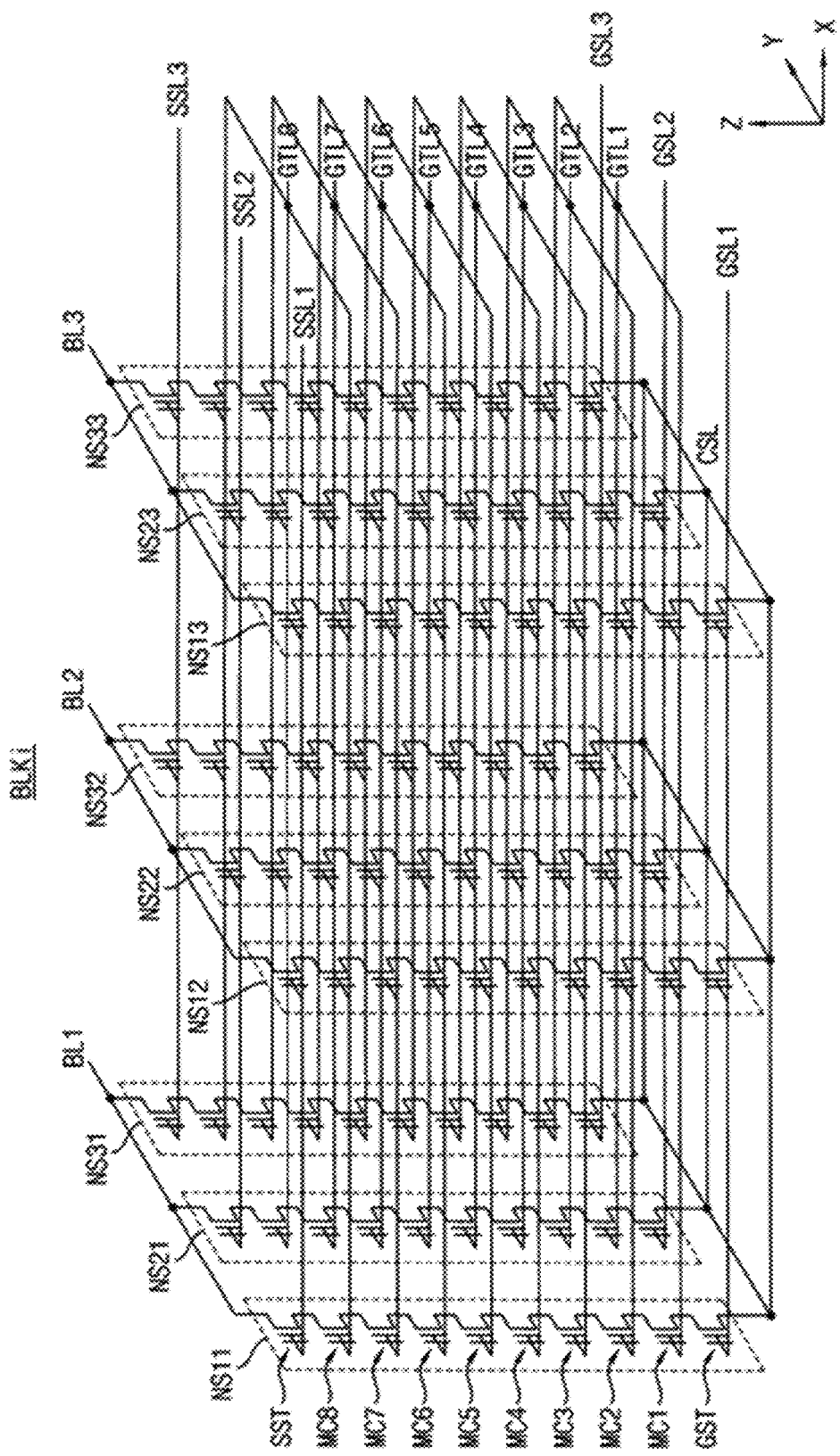
FIG. 7 is a diagram of a 3D V-NAND structure applicable to a UFS device according to embodiments.

FIG. 7 is a diagram of a 3D V-NAND structure applicable to a UFS device according to an embodiment. When a storage module of the UFS device is implemented as a 3D V-NAND flash memory, each of a plurality of memory blocks included in the storage module may be represented by an equivalent circuit shown in FIG. 7.

A memory block BLKi shown in FIG. 7 may refer to a 3D memory block having a 3D structure formed on a substrate. For example, a plurality of memory NAND strings included in the memory block BLKi may be formed in a vertical direction to the substrate.

Referring to FIG. 7, the memory block BLKi may include a plurality of memory NAND strings (e.g., NS11 to NS33), which are connected between bit lines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 7, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines GTL1, GTL2, . . . , and GTL8. The gate lines GTL1, GTL2, . . . , and GTL8 may respectively correspond to word lines, and some of the gate lines GTL1, GTL2, . . . , and GTL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Word lines (e.g., WL1) at the same level may be connected in common, and the ground selection lines GSL1, GSL2, and GSL3 and the string selection lines SSL1, SSL2, and SSL3 may be separated from each other. FIG. 7 illustrates a case in which a memory block BLK is connected to eight gate lines GTL1, GTL2, . . . , and GTL8 and three bit lines BL1, BL2, and BL3, without being limited thereto.

As discussed above, embodiments of the present disclosure may relate to a construction of a family of codes, which may be referred to as H-GCC codes, and which have code dimension and code length constraints suitable for applications of ECC in flash memory.

The H-GCC code structure may include $L_2$ constituent codes, each with K information bits, and code length N. If a systematic encoder is used, the H-GCC code word may include K information bits per constituent code, P total parity bits (where P=N−K) which may be divided to local parity bits $P_L$, which may be used to protect the constituent code, and global parity bits $P_G$ which may share resources between the constituent codes.

The constituent codes may be GCC codes with internal structure and a corresponding transform that may be used to generate a transform space. For each constituent code, the transform space include $M_2$ symbols, each of m bits. Combining $L_2$ symbols together from different constituent codes may generate Reed Solomon (RS) code words in the transform space, resulting in a concatenation of GCC with RS codes.

Figure 8:
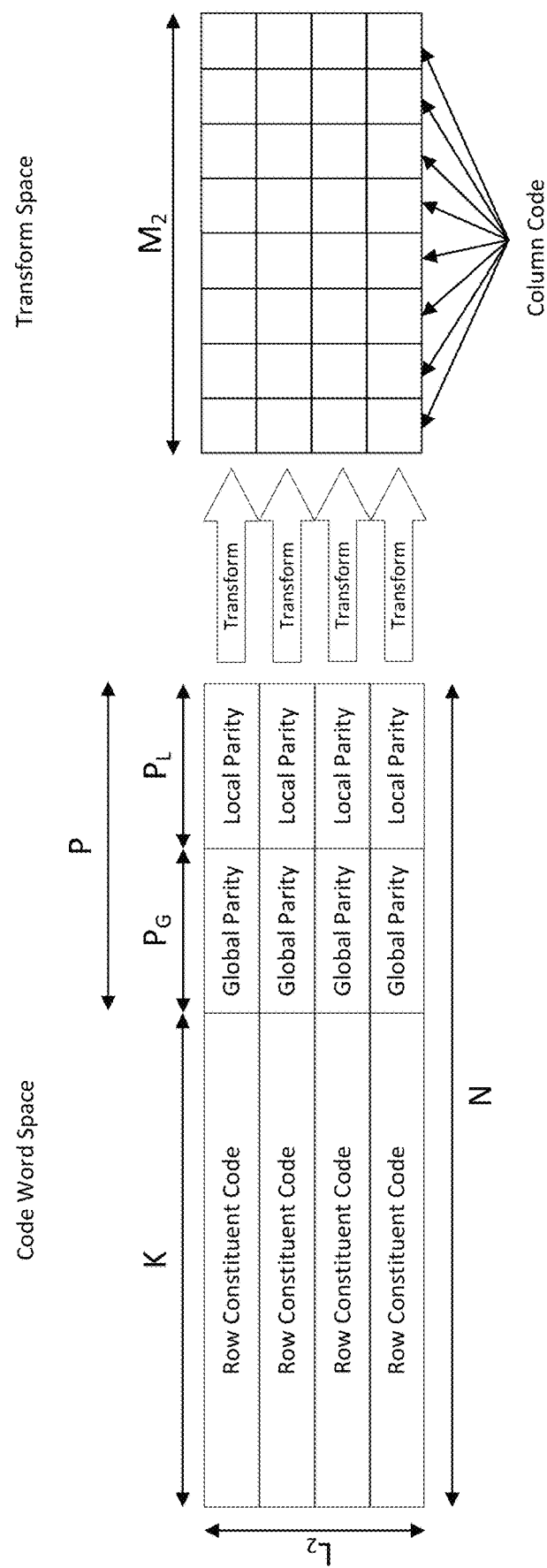
FIG. 8 illustrates an example code structure of an H-GCC code word, according to embodiments.

FIG. 8 illustrates an example code structure of an H-GCC code word, according to embodiments. According to embodiments, the H-GCC code may also be understood to be constructed using concatenations of GCC codes, examples of which are discussed in more detail below. FIGS. 9-23 below relate to various embodiments of the H-GCC code, as well as corresponding parity check matrices and encoder algorithms. For example, according to an embodiment discussed below, a GCC sequential encoder may be used as basic encoder for local parity bits, and the global parity bits may be treated as linear constraints. As another example, according to an embodiment discussed below, a constraint may be placed on the overhead bits location, and if this constraint is met, a sequential encoder may be applicable for the H-GCC.

Figure 9:
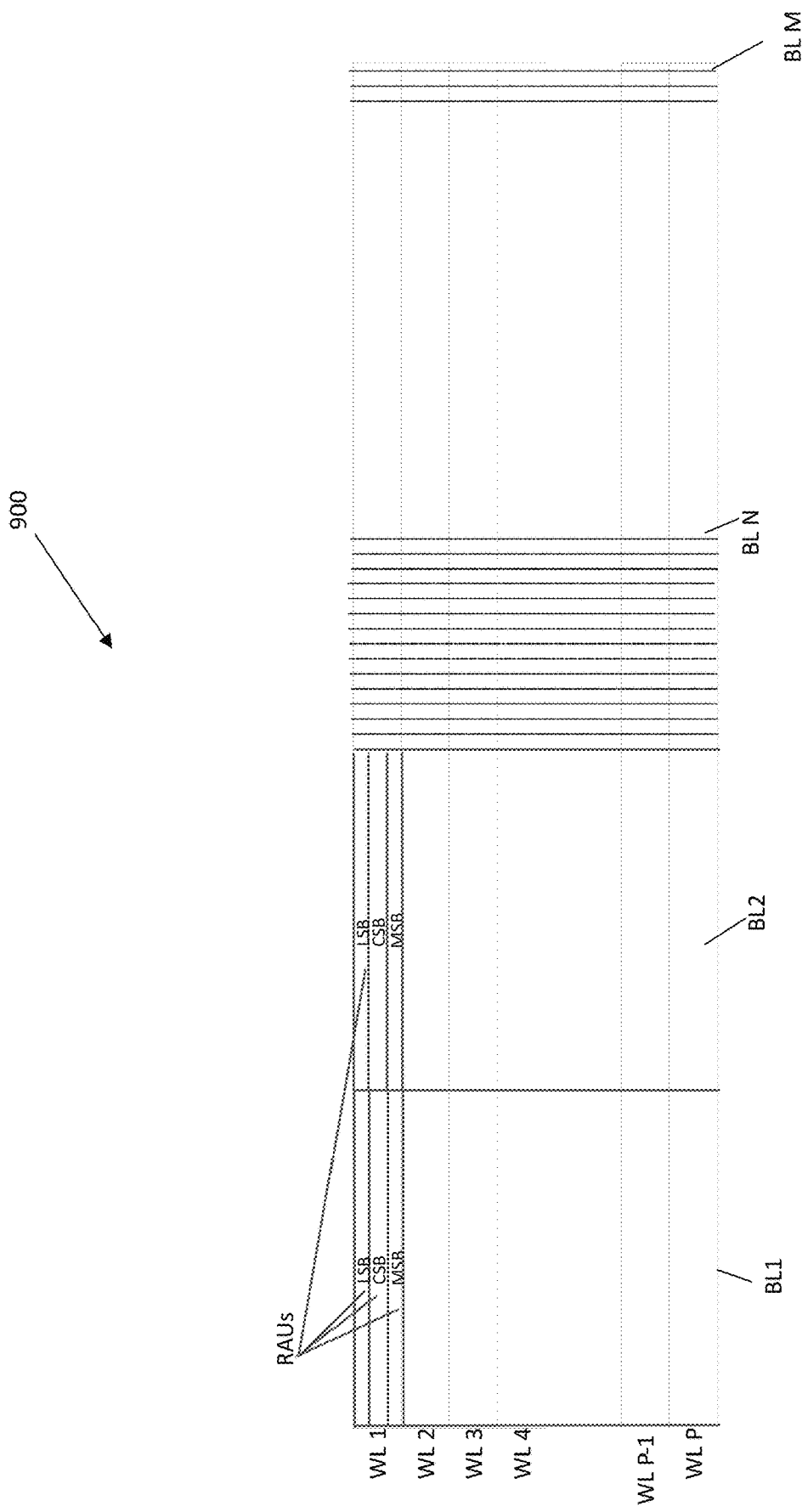
FIG. 9 illustrates an example of a NAND memory block, according to embodiments.

FIG. 9 illustrates an example of a NAND memory block, according to embodiments. In general, a NAND cell may store T bits, where T depends on the particular type of NAND memory cell. For example, a flash memory device which stores one bit per cell (BPC) may be referred to as a single-level cell (SLC), a flash memory device which stores two BPC may be referred to as a multi-level cell (MLC), a flash memory device which stores three BPC may be referred to as a triple-level cell (TLC), a flash memory device which stores four BPC may be referred to as a quadruple-level cell (QLC), and a flash memory device which stores five BPC may be referred to as a penta-level cell (PLC). For example, memory block 900 may be a TLC NAND memory block. As discussed above, a NAND chip may have a structure which includes Z blocks of word lines (WLs), where each WL includes M bit lines (BLs).

To allow fast NAND access, each WL of a NAND memory device may be divided into random access units (RAUs). Generally, if the number of bits to be stored in an RAU is N, the WL may be divided to M/N sectors, where each sector will includes T RAUs, of N BLs, representing one bit out of T, which may be for example as a least significant bit (LSB), a center significant bit (CSB), or a most significant bit (MSB). Accordingly, the number of RAUs in such a block will be Z*T*M/N.

To allow high reliability access, each RAU may be protected with an ECC. For example, the ECC code length for an RAU may be of length N and may accommodate K<N information bits. In general, longer ECC codes may provide better reliability, and therefore there may be an advantage to using longer ECCs. However, the RAU structure may accommodate at most an ECC of a particular length, for example length N.

In order to provide longer ECC codes, some ECC schemes may divide M non equally, to sectors of length $N_1$, $N_2 \ldots N_{M/N}$, such that $M=\Sigma_{i=1}^{M/N} N_i$, where $N_i \neq N_j$. In this way, it may be possible to combine M/N RAUs and encode them together with global parity bits.

However, the constraint that $N_i \neq KN_j$ does not allow a great amount of flexibility in combining RAUs. For example, the constraint $N_i \neq N_j$ may not allow RAUs belonging to the same sector to be connected together, for example by encoding MSB, CSB and LSB together, and may also introduce some loss in the decoding process. Therefore, embodiments may provide an H-GCC coding scheme of hierarchical code, based on GCC codes, that may be feasible with $N_i = N_j$, using an efficient encoder algorithm.

According to embodiments, the notation $[n] \triangleq [1, 2, \ldots n]$ and $[n]^* = [0, 1, 2, \ldots n]$ may be used herein. Vectors may be represented as lower-case bold letters (for example v) and matrices may be represented as upper-case bold letters (for example A). The Kronecker product between an N×M matrix A and a matrix B may be defined according to Equation 1 and Equation 2 below:

$$A = \begin{bmatrix} a_{11} & a_{12} & a_{1M} \\ a_{21} & a_{22} & a_{2M} \\ a_{N1} & a_{N2} & a_{NM} \end{bmatrix} \quad \text{(Equation 1)}$$

$$A \otimes B \triangleq \begin{bmatrix} a_{11} \cdot B & a_{12} \cdot B & a_{1M} \cdot B \\ a_{21} \cdot B & a_{22} \cdot B & a_{2M} \cdot B \\ a_{N1} \cdot B & a_{N2} \cdot B & a_{NM} \cdot B \end{bmatrix} \quad \text{(Equation 2)}$$

An N×N identity matrix may be denoted as $I_N$. In addition, $u_\phi$ may denote the indices $\phi \subseteq [n]$ from a vector u of size n.

According to embodiments, G may denote a polar generator matrix, $\phi_t$ may denote a polar static frozen set at stage t, $P_t$ may denote a polar transform corresponding to $\phi_t$, P(n, k, $\phi$) may denote a polar code of length n, dimension k, and static frozen set $\phi$, and $\phi_i^j$ may denote a union of polar static frozen set up to stage j, as shown in Equation 3 below:

$$\phi_i^j \triangleq \bigcup_{t=i}^{j} \phi_t \quad \text{(Equation 3)}$$

According to embodiments, $\alpha$ may denote a Galois Field primitive element, BCH(n,k,t) may denote a Bose-Chaudhuri-Hocquenghem (BCH) code of length n, dimension k, and error correction capability t. In addition, $B_t$ may denote a BCH transform corresponding to stage t.

According to embodiments, RS(n, F) may denote an RS code of length n (symbols), where $F = d_{min} - 1$. In addition, $R_t$ may denote an RS transform corresponding to stage t.

According to embodiments, Ps(n,k,$\alpha$) may denote a polar subcode code of length n, dimension k, and static and dynamic frozen set $\alpha$. In addition, $\delta_t$ may denote a polar subcode dynamic frozen set at stage t, $\alpha_t$ may denote a polar subcode static and dynamic frozen set at stage t according to Equation 4 below:

$$\alpha_t = \phi_t \cup \delta_t \quad \text{(Equation 4)}$$

In addition, $Z_t$ may denote a polar subcode transform corresponding to $\alpha_t$.

Embodiments may use nested codes may be used as constituent codes. Nested codes may be codes from the same family: $\mathbb{Q}_M \subset \mathbb{Q}_{M-1} \subset \ldots \subset \mathbb{Q}_1$ of length n and dimension $k_j$, where $k_{j_1} \geq k_{j_2}$ for $j_1 < j_2$ and $j_1, j_2 \in [M]$ A code word $c \in \mathbb{Q}_{j_2}$ may also be a code word $c \in \mathbb{Q}_{j_1}$ ($j_1 < j_2$) but with some linear constraint $T_{j_1 \to j_2} \cdot c = s_{j_1 \to j_2}$, where $$T_{j_1 \to j_2} \cdot c = s_{j_1 \to j_2}, \text{ where } T_{j_1 \to j_2} \in \{0, 1\}^{(k_{j_1} - k_{j_2}) \times n}$$

and $$s \in \{0, 1\}^{k_{j_1} - k_{j_2}},$$

such that the effective dimension of the code $\mathbb{Q}_j$ is reduced from $k_{j_1}$ to $k_{j_2}$.

A transform may refer to a linear operation T applied on a constituent code word $c_i$, $i \in [L]$, $c_i \in \{0,1\}^n$ and returning the side information of code word i, $s^i \in \{0,1\}^{k_\sigma - k_{M-1}}$ which may be referred to as the transform space, and may be represented according to Equation 5 and Equation 6 below:

$$s^i = T \cdot c_i \quad \text{(Equation 5)}$$

-continued $$T \triangleq \begin{bmatrix} T_{1\to 2} \\ T_{2\to 3} \\ \ldots \\ \ldots \\ T_{M-1\to M} \end{bmatrix} \quad \text{(Equation 6)}$$

According to embodiments, a polar code word $c \in \{0,1\}^n$ may be represented using an invertible polar transform matrix G and frozen space $u \in \{0,1\}^n$ according to Equation 7 and Equation 8 below:

$$c = G \cdot u \quad \text{(Equation 7)}$$

$$u = G^{-1} \cdot c \quad \text{(Equation 8)}$$

Some of the bits, at locations $\phi \subset [n]$ in u may be known, and may be referred to as frozen bits. The number of frozen bits, $|\phi|$ may represent the code overhead, such that the dimension of the polar code may be $k = n - |\phi|$. A polar code of length n, and dimension k may be represented as $P(n, k, \phi)$, where $c \in P(n, k, \phi)$.

The disjoint sets of frozen bits may be represented as $\phi_t \subset [n]$, $t \in [M]^*$, $\phi_{t_1} \cap \phi_{t_2} = \emptyset \forall t_1 \neq t_2$ and the frozen set may be represented as $\phi_0^j \triangleq \cup_{t=0}^{j} \phi_t$. Corresponding nested polar codes may be represented as $P(n, k_1, \phi_0^j)$, $j \in [M]^*$, with their corresponding dimension $k_j = n - |\phi_0^j|$.

This family of nested codes may be denoted $P(n, k_{0 \to M}, \phi_0^{0 \to M})$, according to Equation 9 below:

$$P(n, k_M, \phi_0^M) \subset P(n, k_{M-1}, \phi_0^{M-1}) \subset \quad \text{(Equation 9)}$$
$$\cdots \subset P(n, k_1, \phi_0^1) \subset P(n, k_0, \phi_0^0)$$

The matrix $U_\phi$ may be a $|\phi|$ over n matrix, that may select from a vector of length n the locations $\phi \subset [n]$ and the corresponding transform $P_\phi$ as shown in Equation 10 below:

$$P_\phi \triangleq U_\phi \cdot G^{-1} \quad \text{(Equation 10)}$$

The transform of the nested code may be represented using the matrices $P_{\phi_t}$, which may be denoted as $P_t \triangleq P_{\phi_t}$ for convenience expressions. The transform space may include the $|\phi_t|$ bits, and symbols $s_t$ as shown in Equation 11 below:

$$s_t = P_t \cdot c, \, t \in [M] \quad \text{Equation 11}$$

The transform space symbols of the polar code word c may be defined according to Equation 12 below:

$$s \triangleq \begin{bmatrix} P_1 \\ P_2 \\ \ldots \\ P_M \end{bmatrix} \cdot c \triangleq P \cdot c \quad \text{(Equation 12)}$$

According to embodiments, a code BCH(n, k, t) may be a BCH code of length n, dimension k, and error correction capability t. The parity check matrix of such a BCH code may be defined using the primitive element $\alpha$ as shown in Equation 13 below:

$$H_t \triangleq \begin{bmatrix} 1 & \alpha & \alpha^2 & \alpha^3 & \cdots & \alpha^{n-1} \\ 1 & \alpha^3 & \alpha^6 & \alpha^9 & \cdots & \alpha^{3 \cdot (n-1)} \\ 1 & \alpha^5 & \alpha^{10} & \alpha^{15} & \cdots & \alpha^{5 \cdot (n-1)} \\ \ldots & \ldots & \ldots & \ldots & \ldots & \ldots \\ 1 & \alpha^{2t-3} & \alpha^{4t-6} & \alpha^{6t-9} & \cdots & \alpha^{(2t-3) \cdot (n-1)} \\ 1 & \alpha^{2t-1} & \alpha^{4t-2} & \alpha^{6t-3} & \cdots & \alpha^{(2t-1) \cdot (n-1)} \end{bmatrix} \quad \text{(Equation 13)}$$

For a set of error corrections parameters $t_j$, $j \in [M]^*$ such that $t_j \leq t_r \forall j < r$, with the corresponding dimension $k_j$, a family of BCH nested codes may be denoted $BCH(n, k_{0 \to M}, t_{0 \to M})$, and may be represented according to Equation 14 below:

$$BCH(n, k_M, t_M) \subset \quad \text{(Equation 14)}$$
$$BCH(n, k_{M-1}, t_{M-1}) \subset \cdots \subset BCH(n, k_0, t_0)$$

For some j, the BCH code $t_{j-1} \to t_j$ coset may be denoted $H_{t_{j-1} \to t_j}$, which may be defined according to Equation 15 below:

$$H_{t_{j-1} \to t_j} \triangleq \begin{bmatrix} 1 & \alpha^{2 \cdot t_{j-1}+1} & \alpha^{2 \cdot (2 \cdot t_{j-1}-1)} & \alpha^{3 \cdot (2 \cdot t_{j-1}-1)} & \cdots & \alpha^{(n-1) \cdot (2 \cdot t_{j-1}+1)} \\ 1 & \alpha^{2 \cdot t_{j-1}+3} & \alpha^{2 \cdot (2 \cdot t_{j-1}+3)} & \alpha^{3 \cdot (2 \cdot t_{j-1}+3)} & \cdots & \alpha^{(n-1) \cdot (2 \cdot t_{j-1}+3)} \\ \ldots & \ldots & \ldots & \ldots & \ldots & \ldots \\ 1 & \alpha^{2 \cdot t_j - 1} & \alpha^{2 \cdot (2 \cdot t_j - 1)} & \alpha^{3 \cdot (2 \cdot t_j - 1)} & \cdots & \alpha^{(n-1) \cdot (2 \cdot t_j - 1)} \end{bmatrix} \quad \text{(Equation 15)}$$

The BCH transform may then be defined according to Equation 16, with the corresponding transform space symbol represented according to Equation 17, and the transform space defined according to Equation 18 below:

$$B_j \triangleq H_{t_{j-1} \to t_j}, \, j \in [M] \quad \text{(Equation 16)}$$

$$s_j = B_j \cdot c \quad \text{(Equation 17)}$$

$$s \triangleq \begin{bmatrix} B_1 \\ B_2 \\ \ldots \\ B_M \end{bmatrix} \cdot c \triangleq B \cdot c \quad \text{(Equation 18)}$$

According to embodiments, a code RS(n, F) may be an RS code of length n and minimum distance F+1.

The parity check matrix of such an RS code may be represented using the primitive element α as shown in Equation 19 below:

$$H_F = \begin{bmatrix} 1 & 1 & 1 & 1 & \cdots & 1 \\ 1 & \alpha & \alpha^2 & \alpha^3 & \cdots & \alpha^{(n-1)} \\ 1 & \alpha^2 & \alpha^4 & \alpha^6 & \cdots & \alpha^{2 \cdot (n-1)} \\ \cdots & \cdots & \cdots & \cdots & \cdots & \cdots \\ 1 & \alpha^{F-2} & \alpha^{2 \cdot (F-2)} & \alpha^{3 \cdot (F-2)} & \cdots & \alpha^{(F-2)(n-1)} \\ 1 & \alpha^{F-1} & \alpha^{2 \cdot (F-1)} & \alpha^{3 \cdot (F-1)} & \cdots & \alpha^{(F-1)(n-1)} \end{bmatrix} \quad \text{(Equation 19)}$$

A set of error corrections parameters may be denoted $F_t$, t=0, 1, 2, ... M such that $F_t \leq F_r \forall t < r$ The family of RS nested codes may be denoted $RS(n, F_{0 \to M})$, and may be represented using Equation 20 below:

$$RS(n, F_M) \subset RS(n, F_{M-1}) \subset \cdots \subset RS(n, F_0) \quad \text{(Equation 20)}$$

The RS code $F_t \to F_r$, $F_t \leq F_r$, coset may be denoted $H_{F_t \to F_r}$, and may be represented using Equation 21 below:

$$H_{F_t \to F_r} = \begin{bmatrix} 1 & \alpha^{F_t} & \alpha^{F_t} & \alpha^{F_t} & \cdots & \alpha^{F_t \cdot (n-1)} \\ \cdots & \cdots & \cdots & \cdots & \cdots & \cdots \\ 1 & \alpha^{F_r-2} & \alpha^{2 \cdot (F_r-2)} & \alpha^{3 \cdot (F_r-2)} & \cdots & \alpha^{(F_r-2)(n-1)} \\ 1 & \alpha^{F_r-1} & \alpha^{2 \cdot (F_r-1)} & \alpha^{3 \cdot (F_r-1)} & \cdots & \alpha^{(F_r-1)(n-1)} \end{bmatrix} \quad \text{(Equation 21)}$$

The RS transform may then be defined according to Equation 22, with the corresponding transform space symbol represented according to Equation 23, and the transform space defined according to Equation 24 below:

$$R_t \triangleq H_{F_t \to F_{t+1}}, t \in [M] \quad \text{(Equation 22)}$$

$$s_t = R_t \cdot c \quad \text{(Equation 23)}$$

$$s \triangleq \begin{bmatrix} R_1 \\ R_2 \\ \cdots \\ R_M \end{bmatrix} \cdot c \triangleq R \cdot c \quad \text{(Equation 24)}$$

According to embodiments, polar sub-codes may be understood as an extension of polar codes. Polar subcodes may include static and dynamic frozen bits, both of which may be defined on the frozen space and generated using the polar transform matrix G.

The static frozen bits may be located as indices $\phi \subset [n]$ and the dynamic frozen bits may be located at indices $\delta \subset [n]$, where $\delta \cap \phi = \emptyset$.

The static frozen bits may be represented as $u_i = f_i$, $i \in \phi$, where $f_i \in \{0,1\}$. For a set of indices $J_i \subset [n]$, with the constraint that $j < i$, $\forall j \in J_i$, the dynamic frozen bit, $u_i$, $i \in \delta$ may satisfy Equation 25 below:

$$\sum_{j \in J_i} u_j + u_i = f_i \quad \text{(Equation 25)}$$

For disjoint sets $\alpha_t \subset [n]$, $t \in [M]$, $\alpha_t$ may represent a union of static and dynamic frozen sets, and may be expressed according to Equation 26 below:

$$\alpha_t = \phi_t \cup \delta_t. \quad \text{(Equation 26)}$$

In Equation 26, $\phi_{t_1} \cap \phi P_{t_2} = \emptyset$, $\delta_{t_1} \cap \delta_{t_2} = \emptyset \forall t_1 \neq t_2$ and $\phi_{t_1} \cap \delta_{t_2} = \emptyset \forall t_1, t_2$.

A polar sub code $Ps(n, k_j, \alpha_0^j)$, $j \in [M]^*$, may be defined with the frozen set $\alpha_0^j = \cup_{t=1}^j \alpha_t$, and the corresponding dimension $k_j = n - |\alpha_0^j|$. The family of polar subcode nested codes may be denoted $Ps(n, k_{0 \to M}, \alpha_0^{0 \to M})$, and may be represented according to Equation 27 below:

$$Ps(n, k_M, \alpha_0^M) \subset Ps(n, k_{M-1}, \alpha_0^{M-1}) \subset \quad \text{(Equation 27)}$$
$$\cdots \subset Ps(n, k_1, \alpha_0^1) \subset Ps(n, k_1, \alpha_0^0)$$

The corresponding transform may be denoted $Z_{\alpha_t}$, and the notation $Z_t = Z_{\alpha_t}$ may be used for convenience. The transform space may include the $|\alpha_t|$ bits, and symbols $s_t$ may be represented according to Equation 28, with the transform space symbols of code word i defined according to Equation 29 below:

$$s_t = Z_t \cdot c, t \in [M] \quad \text{(Equation 28)}$$

$$s \triangleq \begin{bmatrix} Z_1 \\ Z_2 \\ \cdots \\ Z_M \end{bmatrix} \cdot c \triangleq Z \cdot c \quad \text{(Equation 29)}$$

According to embodiments, a GCC may be a code which includes several constituent codes belonging to a nested codes family, a transform to a transform space, and a list of codes in the transform space, with a mapping between the code words and the transform symbols.

Figure 10:
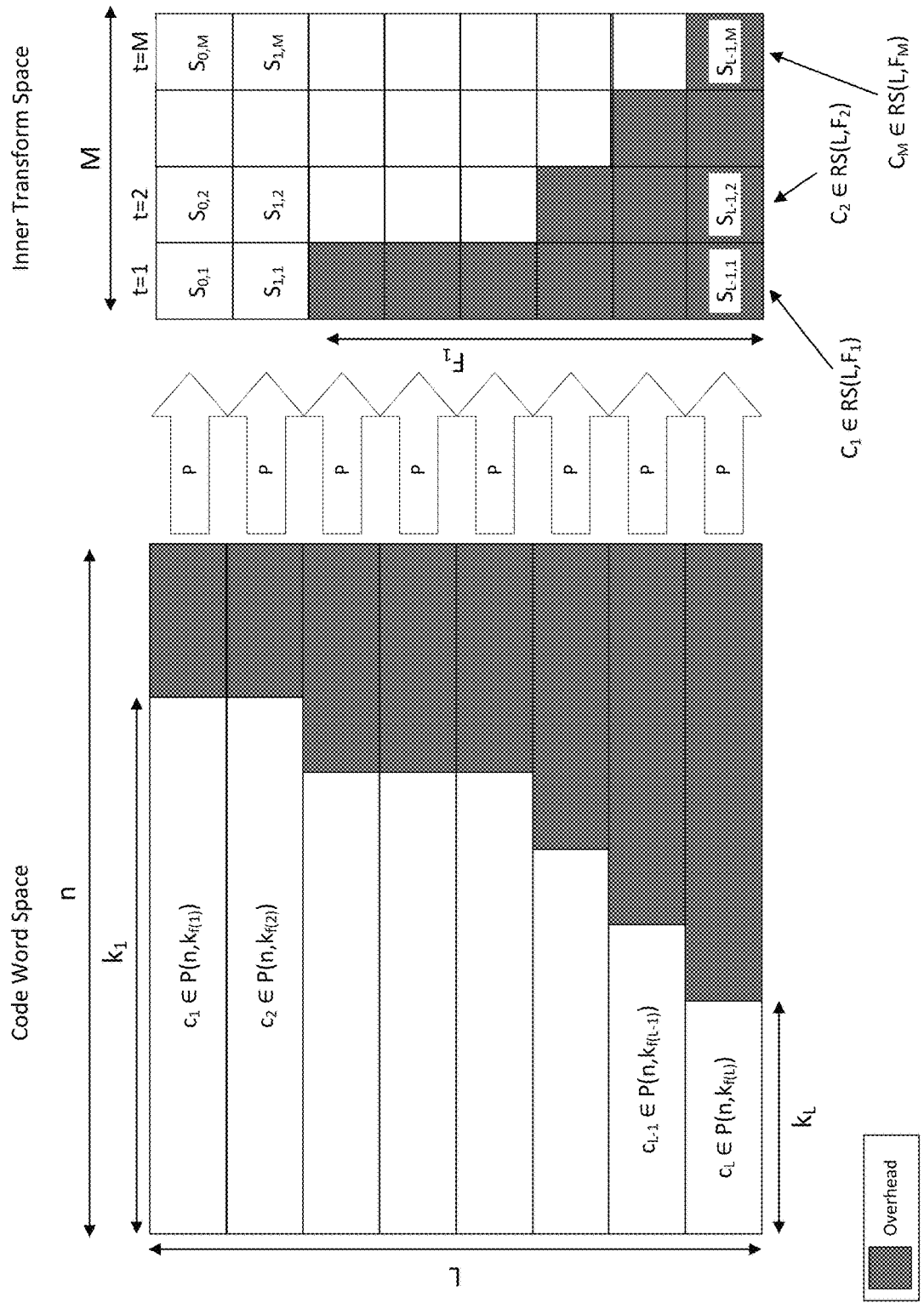
FIG. 10 shows an example code structure of a GCC S-Polar code, according to embodiments.

FIG. 10 shows an example code structure of a GCC S-Polar code, according to embodiments. As shown in FIG. 10, a GCC S-Polar code may refer to a concatenation of polar codes with RS codes. For example, a GCC S-Polar code may relate to a set of nested polar codes as shown in Equation 9, with the corresponding disjoint sets of frozen bits locations $\phi_t \subset [n]$, $t \in [M]$, and $\phi_{t_1} \cap \phi_{t_2} = \emptyset \forall t_1 \neq t_2$ and the frozen set $\phi_0^j \triangleq \cup_{t=0}^j \phi_t$.

A constraint may be added according to Equation 30 and Equation 31

$$|\phi_{i-1}^i| = m \forall i \in [M] \quad \text{(Equation 30)}$$

$$|\phi_0| = n - k_0 \quad \text{(Equation 31)}$$

Accordingly, the GCC S-Polar code may satisfy Equation 32 below:

$$|\phi_1^M| = M \cdot m \quad \text{(Equation 32)}$$

For example, L polar codes may each belong to one of the nested codes of Equation 9, where $c_i \in P(n, k_{h(i)}, \phi_0^{h(i)})$, $i \in [L]$, of length n and dimension $k_{h(i)}$, where $k_{h(1)} \geq \cdots \geq k_{h(L)}$. A function h(i) may map a code word i to the corresponding polar nested code, such that h(1)=0 and h(L)=M. According to embodiments, L≥M, because several polar code words belonging to the same polar code. For the set of static bits $\phi_0 \subset [n]$, define $u_{\phi_0}=0$, and an $[m \cdot M] \times [n]$ transform matrix P may be defined according to Equation 33 below:

$$P \triangleq U_{\phi_1^M} \cdot G^{-1} = \begin{bmatrix} U_{\phi_0^1} \\ U_{\phi_1^2} \\ \cdots \\ U_{\phi_{M-1}^M} \end{bmatrix} \cdot G^{-1} \triangleq \begin{bmatrix} P_1 \\ P_2 \\ \cdots \\ P_M \end{bmatrix} \quad \text{(Equation 33)}$$

The corresponding transform space symbols $s_{i,t}$ may be represented according to Equation 34 below:

$$s_{i,t} = P_t \cdot c_i \text{ for } \forall t \in [M] \text{ and } \forall i \in [L] \quad \text{(Equation 34)}$$

Next, for all $t \in [M]$, the vector of symbols $[s_{i=1,t}, s_{i=2,t}, \ldots s_{i=L,t}]^T$ may be defined as an RS code word $C_t \in RS(L, F_t)$ of length L and dimension $K_t$, where $K_1 \leq K_2 \ldots \leq K_M$, or equivalently with $F_1 \geq F_2 \ldots \geq F_M$, where $0 \leq F_t \leq L$ According to embodiments, there may be a direct relation between $\{k_{f(i)}\}_{i=1}^L$ and $\{F_t\}_{t=1}^M$, where $F_t$ is equal to the number of rows with dimension smaller then $k_1 - t \cdot m$. This relation may be represented according to Equation 35 below:

$$F_t = |\{i | k_{f(i)} < k_1 - t \cdot m\}| \quad \text{(Equation 35)}$$

The GCC S-Polar code may be denoted according to Equation 36 below:

$$GCC(L, M, n, n-k_1, \{F_t\}_{t=1}^M, P(n, k_{0 \to M}, \phi_0^{0 \to M})) \quad \text{(Equation 36)}$$

The GCC S-Polar code is described above using polar codes as constituent codes, but embodiments are not limited thereto. For example, in embodiments, other constituent codes may be used, for example BCH codes or polar sub-codes.

Figure 11:
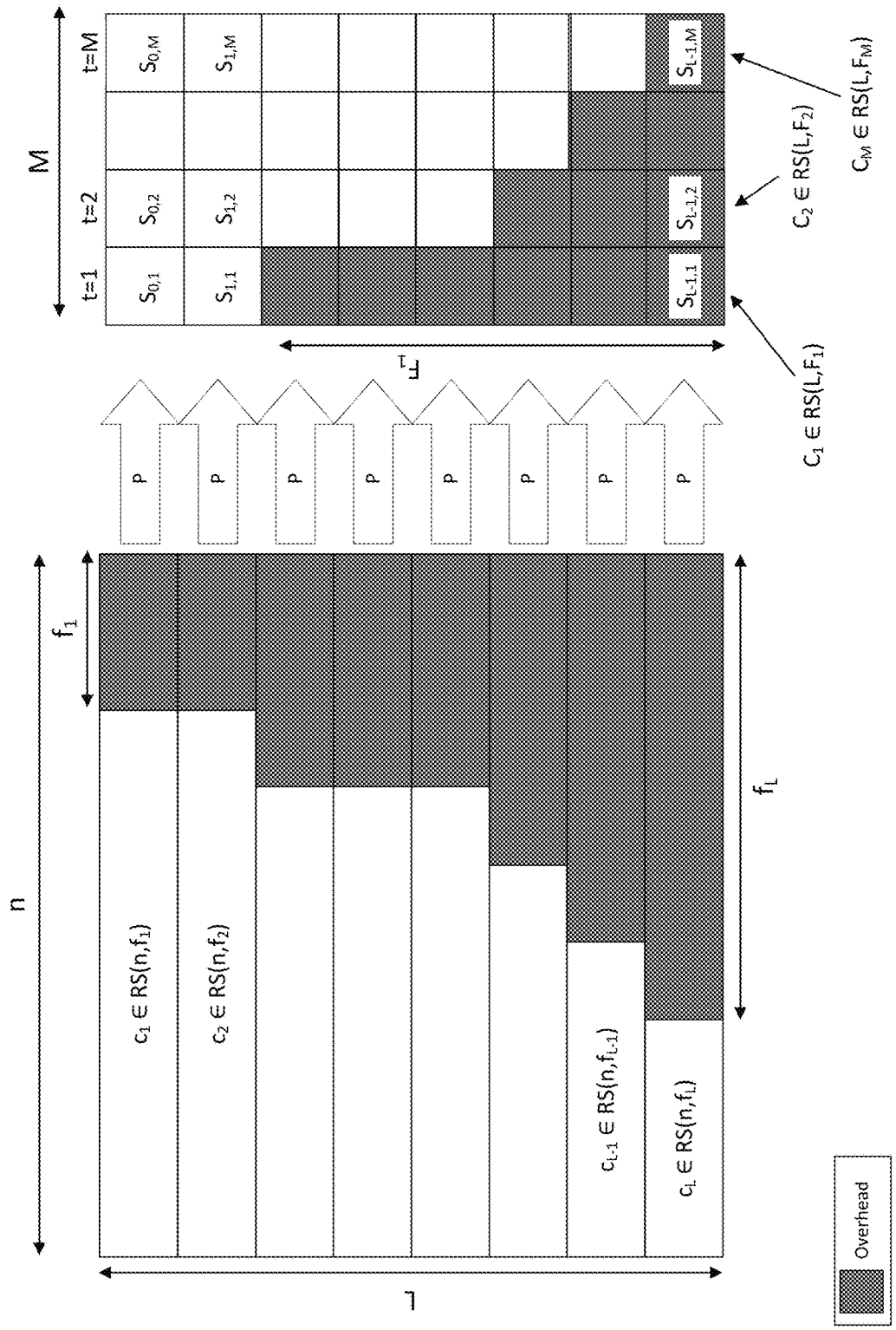
FIG. 11 shows an example code structure of a GCC S-RS code, according to embodiments.

FIG. 11 shows an example code structure of a GCC S-RS code, according to embodiments. As shown in FIG. 11, a GCC S-RS code may refer to a concatenation of RS codes with RS codes.

For example, a GCC S-RS code may relate to a set of nested RS codes, defined over $GF(2^m)$ as shown in Equation 20. A constraint may be added according to Equation 37 and Equation 38:

$$f_i - f_{i-1} = m \forall i \in [M] \quad \text{(Equation 37)}$$

$$|f_0| = n - k_0 \quad \text{(Equation 38)}$$

Accordingly, the GCC S-RS code may satisfy Equation 39 below:

$$f_M - f_0 = M \cdot m \quad \text{(Equation 39)}$$

For example, L RS codes may each belong to one of the nested codes, where $c_i \in RS(n, f_{h(i)})$, $i \in [L]$, of length n and dimension $k_{h(i)}$, where $f_{h(1)} \leq \ldots \leq f_{h(L)}$. The function $h(i)$ may map a code word i to the corresponding RS nested code, such that $h(1)=0$ and $h(L)=M$. An $[m \cdot M] \times [n]$ transform matrix R may be defined according to Equation 40 below:

$$R \triangleq \begin{bmatrix} R_1 \\ R_2 \\ \cdots \\ R_M \end{bmatrix} \quad \text{(Equation 40)}$$

The corresponding transform space symbols $s_{i,t}$ may be represented according to Equation 41 below for $\forall t \in [M]$ and $\forall i \in [L]$:

$$s_{i,t} = R_t \cdot c_i \quad \text{(Equation 41)}$$

Next, for all $t \in [M]$, the vector of symbols $[s_{i=1,t}, s_{i=2,t}, \ldots s_{i=L,t}]^T$ may be defined as an RS code word $C_t \in RS(L, F_t)$ of length L and dimension $K_t$, where $K_1 \leq K_2 \ldots \leq K_M$, or equivalently, $F_1 \geq F_2 \ldots \geq F_M$.

The GCC S-RS code may be denoted according to Equation 42 below:

$$GCC(L, M, n, f_1, \{F_t\}_{t=1}^M, RS(n, f_{0 \to M})) \quad \text{(Equation 42)}$$

FIGS. 12A-12C relate to examples of encoding processes for GCC codes, for example the GCC codes discussed above. According to embodiments, the GCC encoding processes may be performed using any element described above, for example the storage device 200 discussed above with respect to FIG. 2A, the ECC encoding circuit 510 discussed above with respect to FIG. 2B, or any other element.

FIG. 12A illustrates an example of a sequential encoding algorithm which may be used to perform GCC encoding, presented in pseudo-code as Algorithm 1. According to embodiments, a GCC systematic encoder may be applied for any GCC code parameters. For example, according to embodiments, a GCC systematic encoder may perform an encoding operation corresponding to Algorithm 1 on a GCC code word according to Equation 43 below:

$$w_p \in GCC(L, M, n, n-k_1, \{F_t\}_{t=1}^M, P(n, k_{0 \to M}, \phi_0^{0 \to M})) \quad \text{(Equation 43)}$$

The GCC encoder algorithm may include criss-cross activations of a coset systematic polar encoder and RS systematic encoder. In embodiments, the coset polar encoder may be represented according to Equation 44 below:

$$c = ENC_{Polar}(i, u_\phi) \quad \text{(Equation 44)}$$

The coset polar encoder according to Equation 44 may receive information bits i and frozen values $u_\phi$ at locations $\phi$, and may return a systematic encoded word c, where $|u_\phi|=|\phi|$ and $|i|=n-|\phi|$. According to embodiments, the information bits may be located in the first bits $[n-|\phi|]$.

The RS systematic encoder may be represented according to Equation 45 below:

$$v = ENC_{RS}(u, F) \qquad \text{(Equation 45)}$$

The RS systematic encoder according to Equation 45 may receive information symbols u and return RS code word symbols v to generate an RS code word with $d_{min}=F+1$, where $|u|=L-F$ and $|v|=L$.

FIG. 12B illustrates an example encoding order which may correspond to the GCC encoder algorithm discussed above. As shown in FIG. 12B, the code number of information bits is $\Sigma_{i=1}^{L} k_i$ and the code number of overhead bits is $L \cdot n - \Sigma_{i=1}^{L_1} k_i$. The information bits locations may be provided by Equation 46 below:

$$\gamma = \bigcup_{i=1}^{L} [(i-1) \cdot n + 1, (i-1) \cdot n + k_i] \qquad \text{(Equation 46)}$$

As shown in FIG. 12B, at operation 1221A, GCC parity bits for polar code words at i=[1,2] may be determined using a polar encoder. At operation 1221B, the transform space for the polar code words at i=[1,2] may be determined using a transform, for example as shown in Equation 34. At operation 1221C, RS parity bits for the RS code word at t=1 may be determined using an RS encoder.

As further shown in FIG. 12B, at operation 1222A, GCC parity bits for polar code words at i=[3,4,5] may be determined using the polar coset encoder based on the transform space symbols of t=1, generated in operation 1221C. At operation 1222B, the transform space for the polar code words at i=[3,4,5] may be determined using the transform. At operation 1222C, RS parity bits for an RS code word at t=2 may be determined using the RS encoder.

As further shown in FIG. 12B, at operation 1223A, GCC parity bits for a polar code word at i=[6] may be determined using the polar coset encoder based on the transform space symbols of t=[1,2], generated in operations 1221C and 1222C. At operation 1223B, the transform space for the polar code word at i=[6] may be determined using the transform. At operation 1223C, RS parity bits for an RS code word at t=3 may be determined using the RS encoder.

As further shown in FIG. 12B, at operation 1224A, GCC parity bits for a polar code word at i=[7] may be determined using the polar coset encoder based on the transform space symbols of t=[1,2], generated in operations 1221C, 1222C, and 1223C. At operation 1224B, the transform space for the polar code word at i=[7] may be determined using the transform. At operation 1224C, RS parity bits for an RS code word at t=3 may be determined using the RS encoder.

As further shown in FIG. 12B, at operation 1225A, GCC parity bits for a polar code word at i=[8] may be determined using the polar coset encoder based on the transform space symbols of t=[1,2], generated in operations 1221C, 1222C, 1223C, and 1224C.

According to embodiments, operations 1221A, 122A, 1223A, 1224A, and 1225A may correspond to "Step a" of Algorithm 1, operations 1221B, 122B, 1223B, and 1224B may correspond to "Step b" of Algorithm 1, and operations 1221C, 1222C, 1223C, and 1224C may correspond to "Step c" of Algorithm 1.

FIG. 12C is a flowchart of an encoding process, according to embodiments. For example, process 1200 as shown in FIG. 12C may correspond to some or all of Algorithm 1 discussed above. In embodiments, some or all of process 1200 may be performed using a polar coset encoder, for example the polar coset encoder discussed above. For example, at operation 1231, the process 1200 may include encoding a next polar code word. At operation 1232, the process 1200 may include updating the transform space corresponding to the encoded polar code word. At operation 1233, the process 1200 may include determining whether the last polar code word has been reached. Based on determining that the last polar code word has been reached (YES at operation 1233), the process 1200 may proceed to operation 1234, and output the GCC code word. Based on determining that the last polar code word has not been reached (NO at operation 1233), the process 1200 may proceed to operation 1235, which may include determining whether the next polar code word has a same degree as the polar code word encoded in operation 1231. Based on determining that the next polar code word does have the same degree (YES at operation 1235), the process 1200 may return to operation 1231. Based on determining that the next polar code word does not have the same degree (NO at operation 1235), the process 1200 may proceed to operation 1236.

At operation 1236, the process 1200 may include encoding a next RS code word. At operation 1237, the process 1200 may include determining whether the last RS code word has been reached. Based on determining that the last RS code word has been reached (YES at operation 1237), the process 1200 may proceed to operation 1238, which may include updating the polar code words based on results of encoding the RS code words, and then returning to operation 1231. Based on determining that the last RS code word has not been reached, the process 1200 may proceed to operation 1239, which may include determining whether the next RS code word has a same degree. Based on determining that the next RS code word does have the same degree (YES at operation 1235), the process 1200 may return to operation 1236. Based on determining that the next RS code word does not have the same degree (NO at operation 1235), the process 1200 may proceed to operation 1238.

According to embodiments, the GCC encoding processes discussed above may be performed using any element described herein, for example the storage device 200 discussed above with respect to FIG. 2A, the ECC encoding circuit 510 discussed above with respect to FIG. 2B, or any other element.

According to embodiments, the GCC could instead be defined with a polar subcode as constituent code, or with BCH code as constituent code, and different systematic encoders may be used.

Figure 13:
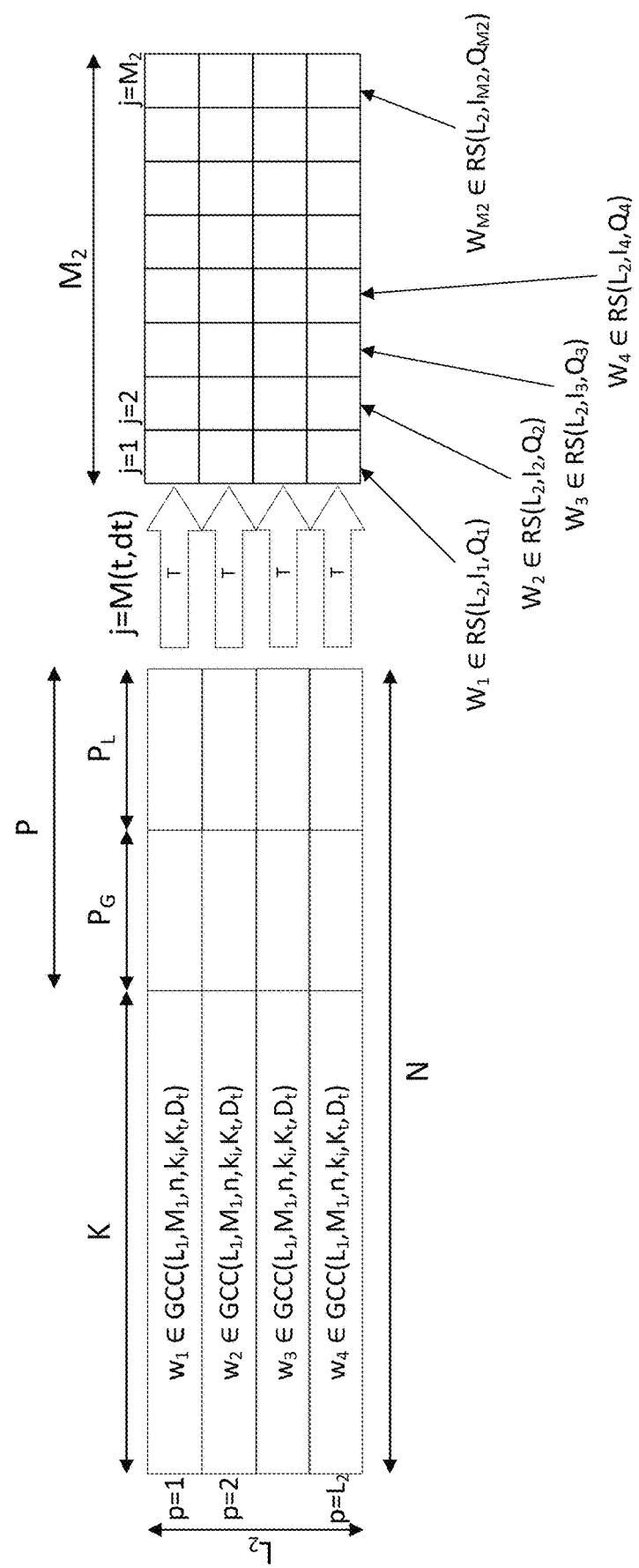
FIG. 13 illustrates an example of a code structure for an H-GCC code.

FIG. 13 illustrates an example of a code structure for an H-GCC code, according to embodiments. As shown in FIG. 13, an H-GCC code may be represented using a family of GCC nested codes with a transform T to a transform space of $M_2$ symbols. In embodiments, the H-GCC may be a general concatenation of $L_2$ independent GCC codes (which may correspond to $L_2$ RAUs), each of length N, dimension K, with $P_L$ local parity bits and $P_G$ global parity bits, and using $M_2$ RS codes in the transform space.

According to embodiments, the H-GCC code may relate to a GCC code corresponding to a RAU, as discussed above.

For example, the H-GCC code may correspond to $L_2$ GCC code words, $w_p$, $p \in [L_2]$, represented according to Equation 47 below:

$$w_p \in GCC\left(L_1, M_1, n, n-k_1, \{F_t\}_{t=1}^{M_1}, P\left(n, k_{0\to M_1}, \phi_0^{0\to M_1}\right)\right) \quad \text{(Equation 47)}$$

The GCC code may be a concatenation of $L_1$ polar codes $c_i \in P(n, k_{h(i)}, \phi_0^{h(i)})$, $i \in [1, L_1]$, of dimensions $k_{h(1)} \leq k_{h(2)} \leq \ldots \leq k_{h(L_1)}$ with $M_1$ RS codes $C_t \in RS(L_1, F_t)$, of dimension $K_1 \leq K_2 \leq \ldots \leq K_{M_1}$ and $F_t = L_1 - K_t$.

The GCC concatenation may be achieved as discussed above with respect to Equation 34, as shown in Equation 48 below:

$$s_{t,i} = P_t \cdot c_i, \, i \in [L_1], \, t \in [M_1] \quad \text{(Equation 48)}$$

With respect to the H-GCC code structure, this transform space may be referred to as an inner transform space.

In order to construct a second transform space, which may be referred to as the outer transform space, first a list of numbers $D_t$, $t \in [M_1]$, $0 \leq D_t \leq L_1 - K_t$ and the corresponding transforms $H_{F_t, F_t+q}$ $\forall q \in [D_t]$ where $H_{F_t \to F_t+q}$ may be defined, as shown for example in Equation 21.

The outer transform space may be defined as the symbols $S_{t,q}$ as shown in Equation 49 and Equation 50, which may be equivalent to each other:

$$S_{t,q} = H_{F_t, F_t+q} \cdot C_t \quad t \in [M_1], q \in [D_t] \quad \text{(Equation 49)}$$

$$S_{t,q} = H_{F_t, F_t+q} \cdot P_t \cdot \begin{bmatrix} c_1 \\ c_2 \\ \ldots \\ c_{L_1} \end{bmatrix}, \, t \in [M_1], q \in [D_t] \quad \text{(Equation 50)}$$

For each t, the transform may be defined according to Equation 50 below:

$$H_t \triangleq \begin{bmatrix} H_{F_t, F_t+1} \\ H_{F_t, F_t+2} \\ \ldots \\ H_{F_t, F_t+D_t} \end{bmatrix} \quad \text{(Equation 51)}$$

Figure 14:
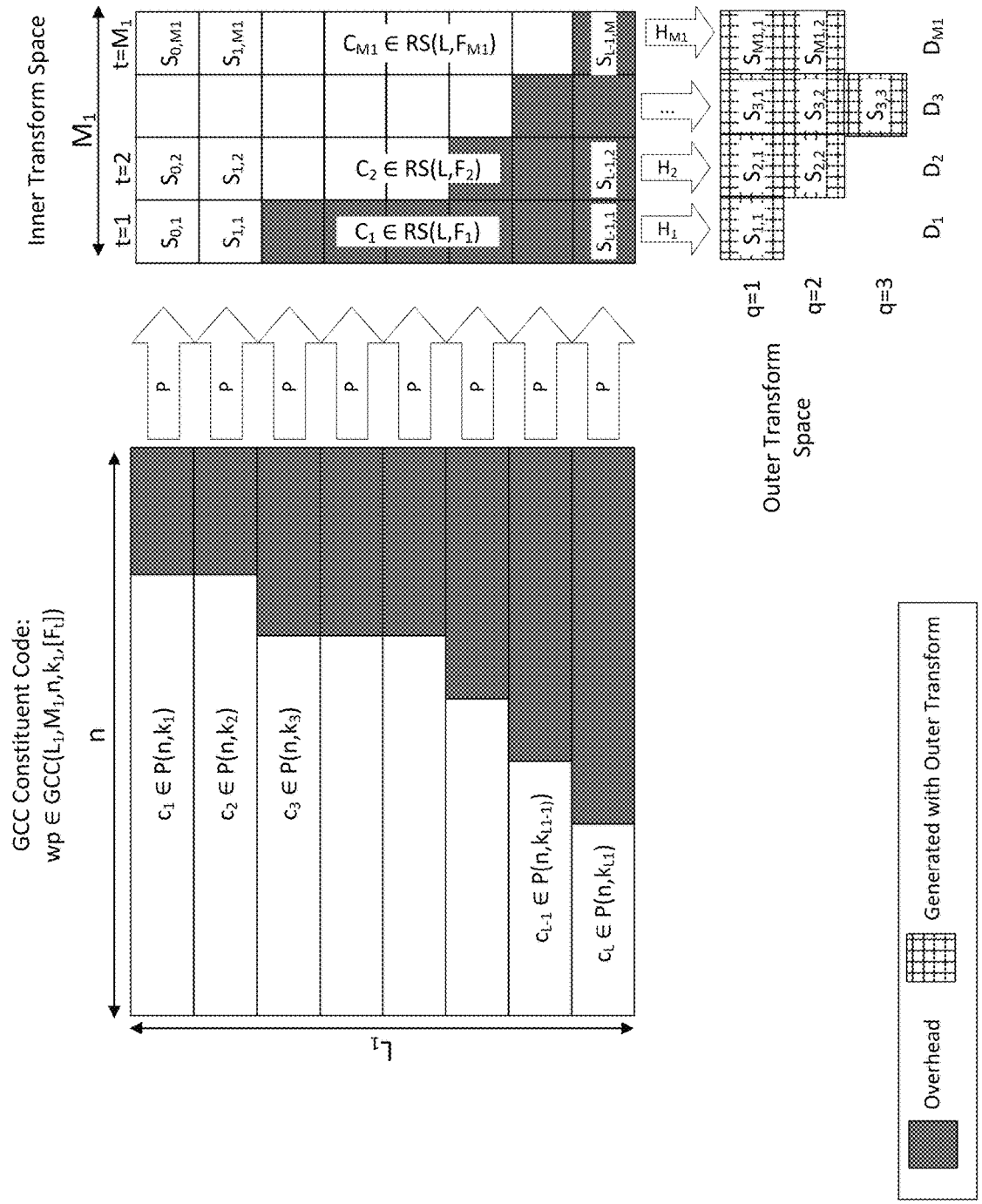
FIG. 14 illustrates an example of an inner transform space and an outer transform space, according to embodiments.

FIG. 14 illustrates an example of the inner transform space and the outer transform space, according to embodiments. As shown in FIG. 14, the GCC code length may be $N = L_1 \cdot n$, and the overhead is $P_L = \sum_{i=1}^{L_1}(n-k_i)$, where $P_L$ may correspond to the local overhead of the RAU.

The next hierarchy of the H-GCC may be defined by concatenating $L_2$ GCC constituent code words as discussed above with RS codes.

A mapping $j = M(t,q)$ may be defined between the outer transform Space symbols $(t,q)$, $t \in [1, M_1]$, $q \in [1, D_t]$ and j RS codes, $j \in M_2$ and $M_2 \triangleq \sum_{t=1}^{M_1} D_t$, such that a symbol $S_j$ may be defined according to Equation 52, and the corresponding transform may be represented according to Equation 53 below:

$$S_j \triangleq S_{M(t,q)} = H_{F_t, F_t+q} \cdot P_t \cdot \begin{bmatrix} c_1 \\ c_2 \\ \ldots \\ c_L \end{bmatrix} \quad \text{(Equation 52)}$$

$$T_j = T_{M(t,q)} \triangleq H_{F_t, F_t+q} \cdot P_t, \, j \in M_2 \quad \text{(Equation 53)}$$

The transform may be applied for each of the constituent codes $w_p$. The polar codes of the constituent codes of $w_p$ may be denoted as $c_i^p$. Accordingly, the transform space symbols may be defined according to Equation 54, and the transform may be defined according to Equation 55 below:

$$S_j^p \triangleq H_{F_t, F_t+q} \cdot P_t \cdot \begin{bmatrix} c_1^p \\ c_2^p \\ \ldots \\ c_{L_1}^p \end{bmatrix} = T_j \cdot w_p, \, j \in [M_2], p \in [L_2] \quad \text{(Equation 54)}$$

$$T \cdot w_p \triangleq \begin{bmatrix} T_1 \\ T_2 \\ \ldots \\ T_{M_2} \end{bmatrix} \cdot w_p = \begin{bmatrix} S_1^p \\ S_2^p \\ \ldots \\ S_{M_2}^p \end{bmatrix} \quad \text{(Equation 55)}$$

The RS code concatenation may be performed by defining $M_2$ RS codes $W_j \in RS(L_2, Q_j)$, where $j \in [1, M_2]$ and $I_1 \leq I_2 \leq \ldots \leq I_{M_2}$ are the RS codes dimensions, and $Q_j = L_2 - I_j$.

The RS code word $W_j$ may be represented according to Equation 56, and the corresponding parity check matrix $H_{Q_j}$ may be represented according to Equation 57 below:

$$W_j = \begin{bmatrix} S_j^{p=1} \\ S_j^{p=2} \\ \ldots \\ S_j^{p=L_2} \end{bmatrix} \quad \text{(Equation 56)}$$

$$H_{Q_j} \cdot \begin{bmatrix} S_j^1 \\ S_j^2 \\ \ldots \\ S_j^{L_2} \end{bmatrix} = 0 \, \forall \, j \in [M_2] \quad \text{(Equation 57)}$$

The additional (global) overhead allocated by each of the $w_p$ constituent codes may be constant for each $p \in L_2$, and may be equal to $$P_G = \frac{m}{L_2} \sum_{j=1}^{M_2} Q_j,$$

resulting in the dimension $K = N - P_L - P_G$.

In embodiments, the H-GCC code illustrated in FIG. 13 may be represented using the concatenation of $L_2$ GCC codes, as shown in Equation 58 below:

$$w_p \in GCC\left(L_1, M_1, n, k_1, \{F_t\}_{t=1}^{M_1}, P\left(n, k_{0\to M_1}, \phi_0^{0\to M_1}\right)\right) \quad p \in [L_2] \quad \text{(Equation 58)}$$

A corresponding transform P may be obtained by using the transform of Equation 33, and defining the polar constituent codes belonging to $w_p$ as $c_i^p$. The resulting transform matrix may be defined as shown in Equation 59:

$$s_{i,t}^p \triangleq P_t \cdot c_i^p, \, p \in [L_2], \, t \in [M_1], \, i \in [L_1] \quad \text{(Equation 59)}$$

A set of S-RS decoder codes may then be represented according to Equation 60 below:

$$W_t \in SRS(L_2, D_t, L_1, F_t, [Q_{t,q}]_{q=1}^{D_t}), \, t \in [M_1] \quad \text{(Equation 60)}$$

The S-RS code word $W_t$ may include the RS code words $C_t^p$, $t \in [M_1]$, $p \in p[L_2]$, where the RS code word $C_t^p$ may be defined on the symbols $s_{i,t}^p$, $i \in [L_1]$, as shown in Equation 61 below:

$$W_t \triangleq \begin{bmatrix} C_t^1 \\ C_t^2 \\ \cdots \\ C_t^{L_2} \end{bmatrix} = \begin{bmatrix} s_{1,t}^1 \\ \cdots \\ s_{L_1,t}^1 \\ s_{1,t}^2 \\ \cdots \\ s_{L_1,t}^2 \\ \cdots \\ s_{1,t}^{L_2} \\ \cdots \\ s_{L_1,t}^{L_2} \end{bmatrix} \quad \text{(Equation 61)}$$

Figure 15:
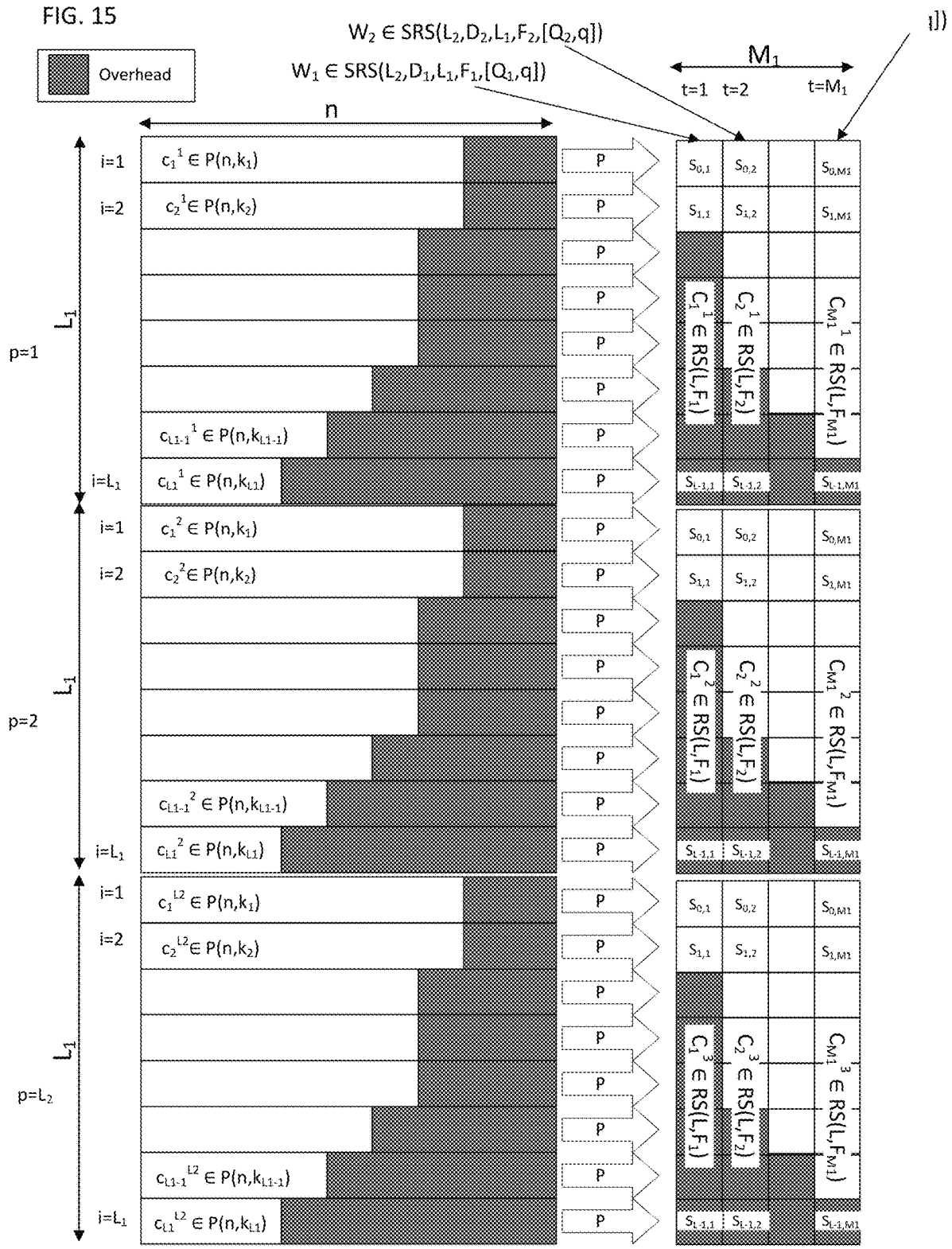
FIG. 15 illustrates an example of a code structure for an H-GCC code, according to embodiments.

FIG. 15 illustrates an example of the H-GCC code structure discussed above. In embodiments, the S-RS code word $W_t$ may include $L_2$ RS codes $C_t^p$, $p \in [L_2]$ and a transform $R^t \triangleq H_{F_t+1 \to F_t+D}$. Accordingly, the transform space represented below as Equation 62 may be formed:

$$S_{M(t,q)}^p \triangleq S_{t,q}^p = R^t \cdot C_t^p, \, p \in [L_2], \, q \in [D_t], \, t \in [M_1] \quad \text{(Equation 62)}$$

Figure 16:
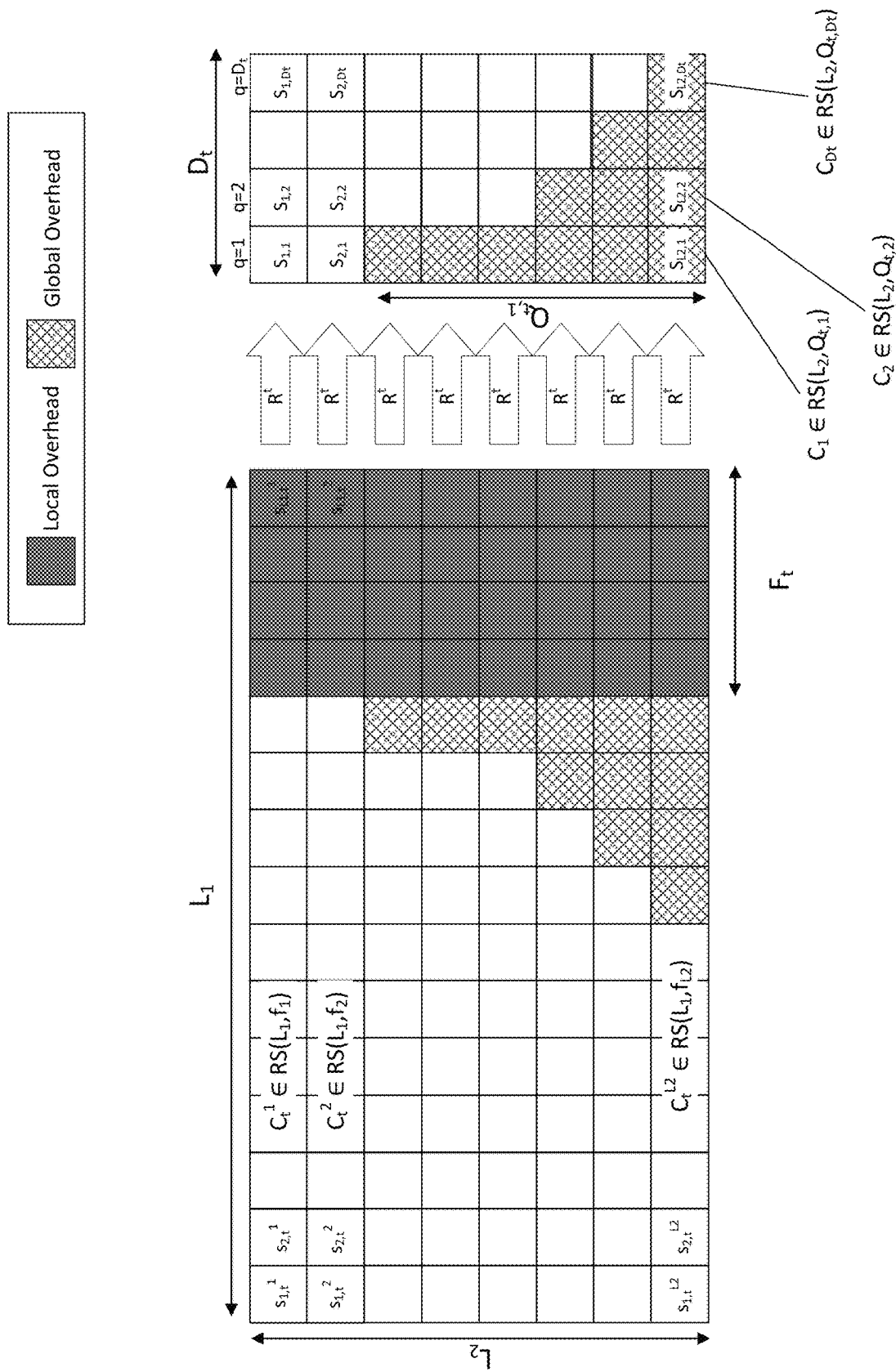
FIG. 16 illustrates an example of RS codes corresponding to the H-GCC code structure of FIG. 15, according to embodiments.

FIG. 16 illustrates an example of the corresponding RS codes with $Q_{t,q} = Q_{M(t,q)} = Q_j$ for $p \in [L_2], q \in [D_t], t \in [M_1], j \in [M_2]$.

The hierarchical code discussed above may be a linear code with a parity check matrix. For example, the H-GCC code word may be a concatenation of GCC constituent codes:

$$w_{H-GCC} = \begin{bmatrix} w_1 \\ w_2 \\ \cdots \\ w_{L_2} \end{bmatrix}$$

and the GCC constituent code may be a concatenation of polar codes:

$$w_p = \begin{bmatrix} c_1^p \\ c_2^p \\ \cdots \\ c_{L_1}^p \end{bmatrix}$$

FIGS. 17A to 21 may be used to illustrate examples of encoding processes for H-GCC codes such as those discussed above. According to embodiments, the H-GCC encoding processes may be performed using any element described above, for example the storage device 200 discussed above with respect to FIG. 2A, the ECC encoding circuit 510 discussed above with respect to FIG. 2B, or any other element.

According to embodiments, an H-GCC encoder corresponding to one or more of the H-GCC codes discussed above may receive K information bits for each one of the $L_2$ RAUs, and may generate $L_2$ code words, each with local parity $P_L$ that may enable the decoding of each RAU separately, and additional global parity bits $P_G$ that may be used used to decode the $L_2$ RAU jointly.

FIGS. 17A-18B relate to a first example H-GCC encoding process. In particular, according to FIGS. 19A-20B, the first example H-GCC encoding process may performed using a simple systematic encoder with linear constraints. In embodiments, the first example H-GCC encoding process may relate to the H-GCC code structure discussed above with respect to FIG. 14.

In embodiments, a basic encoder used to perform the first example H-GCC encoding process may include $L_2$ GCC encoders. In embodiments, the basic encoder may correspond to the basic encoder 1713 discussed below with respect to FIGS. 17A and 17B, and each of the $L_2$ GCC encoders may correspond to the GCC encoder discussed above with respect to FIGS. 12A to 12C.

The GCC code used for this basic encoder may correspond to a GCC code word which may be a nested code of $w_p$, as shown in Equation 63 below:

$$w_p \in GCC\left(L_1, M_1, n, n-k_0, \{F_t\}_{t=1}^{M_1}, P\left(n, k_{0 \to M_1}, \phi_0^{0 \to M_1}\right)\right) \quad \text{(Equation 63)}$$

The information bits and the balancing bits may be located at the information indices $\gamma$ as shown in Equation 46 above for the code word $w_p$. In embodiments, Equation 64 may be satisfied:

$$|\gamma| = N - P_L \quad \text{(Equation 64)}$$

Next, additional $\beta_p \subset \gamma$ balance bit locations may be defined, such that $|\beta_p| = P_G$. The information bits may be located at $\alpha_p = \gamma \backslash \beta_p$, and $|\alpha_p| = N - P_L - P_G$. The selection of $\beta_p$ should be such that a transition matrix $T_c$ used for the H-GCC encoding is invertible. An example of the transition matrix $T_c$ is discussed below with respect to FIGS. 18A and 18B.

The H-GCC constraint may specify that all of the words in the transform space parity check will be 0. This constraint may be used to specify a constraint matrix $P_c$ and the constraint vector $d_w = 0$, which may be used to perform encoding of H-GCC codewords. An example of such encoding is discussed below with respect to FIGS. 17A and 17B.

The constraint matrix $P_c$ may be formed as follows. Using the transform defined in Equation 54 and Equation 55 above, the transform space may be defined according to Equation 65 below:

$$T \cdot w_p \triangleq \begin{bmatrix} T_1 \\ T_2 \\ \cdots \\ T_{M_2} \end{bmatrix} \cdot w_p = \begin{bmatrix} S_1^p \\ S_2^p \\ \cdots \\ S_{M_2}^p \end{bmatrix}, \, p \in [L_2] \quad \text{(Equation 65)}$$

The transform space may include $M_2$ RS codes, $W_j \in RS(L_2, Q_j)$, $j \in [1, M_2]$, which may be represented as shown in Equation 66 below:

$$W_j = \begin{bmatrix} S_j^{p=1} \\ S_j^{p=2} \\ \ldots \\ S_j^{p=L_2} \end{bmatrix} \quad \text{(Equation 66)}$$

To guarantee the word is a H-GCC code word, all $W_j$ RS code words may satisfy Equation 67 below:

$$H_{Q_j} \cdot W_j = 0 \forall j \in [M_2] \quad \text{(Equation 67)}$$

Further, $H_F$ may be used according to Equation 19 above. The total number of constraints may be represented as Equation 68 below:

$$L_c = m \cdot \sum_{j=1}^{M_2} Q_j = L_2 \cdot P_G. \quad \text{(Equation 68)}$$

Using those constraints, the transition matrix $T_c$ may be generated as discussed below with respect to FIGS. 18A and 18B.

Based on the information locations $\alpha_p$ and the balance bits locations $\beta_p$, $p \in [L_2]$, the constraint matrix $P_c$, the transition matrix $T_c$, and the basic encoder, the H-GCC encoding according to the first example may proceed as discussed below with respect to FIGS. 17A and 17B. In embodiments, parameters for the first example H-GCC encoding scheme may be represented as shown in Equation 69, Equation 70, and Equation 71 below, in which $k_c$ represents a length of an input vector of the basic encoder, and ne represents a length of codewords of the basic encoder:

$$L_c = L_2 \cdot P_G \quad \text{(Equation 69)}$$

$$k_c = L_2 \cdot (K + P_L) \quad \text{(Equation 70)}$$

$$n_c = L_2 \cdot N \quad \text{(Equation 71)}$$

Figure 17A:
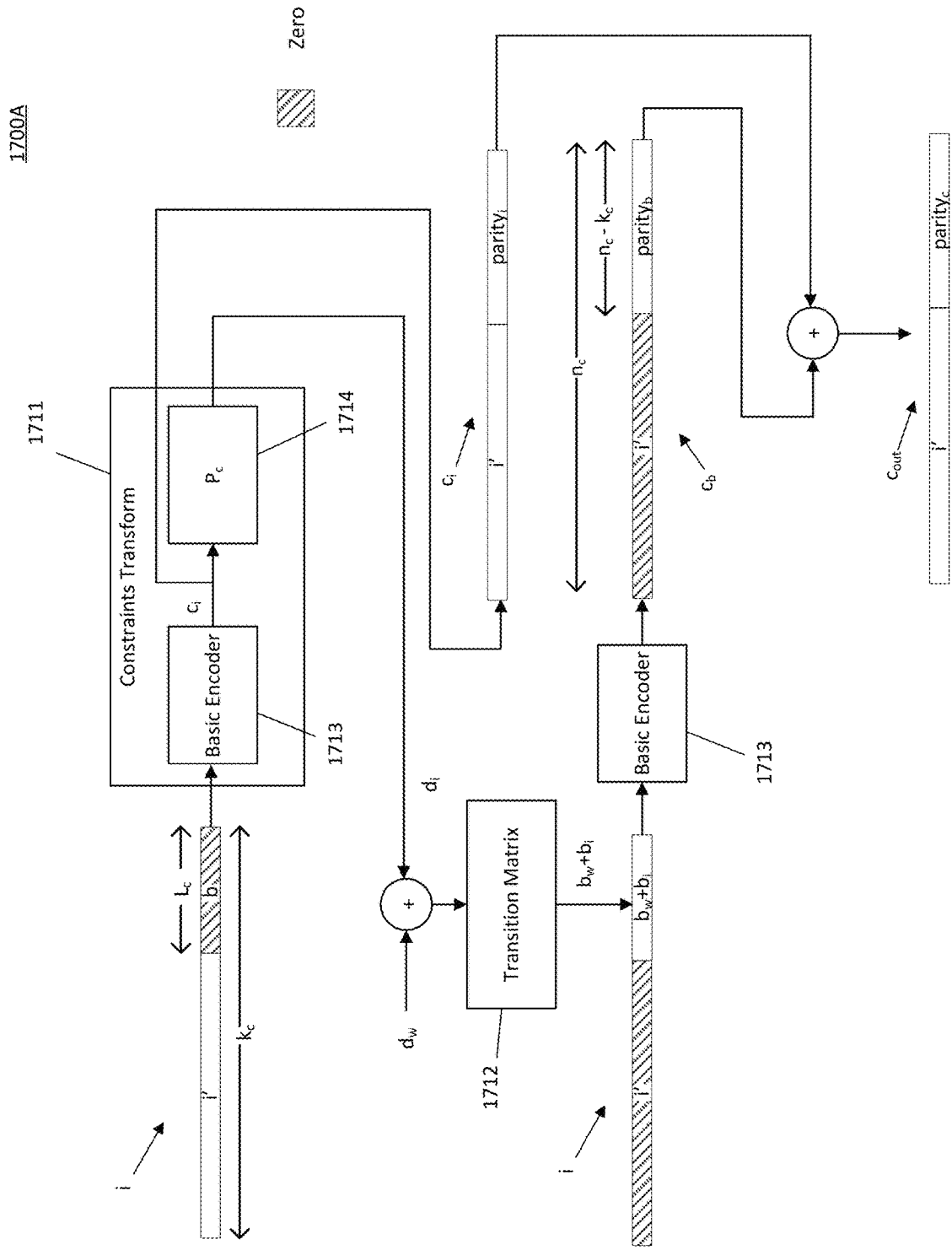
FIG. 17A illustrates an example of a process for constructing a transition matrix, according to embodiments.

FIG. 17A is a block diagram of an example of an encoder 1700A for encoding information bits to generate an output H-GCC code word according to the first example H-GCC encoding process, according to embodiments. In embodiments, the encoder 1700A may include constraints transform module 1711, a transition matrix module 1712, a basic encoder 1713, and a constraints matrix module 1714.

The basic encoder 1713 may be a systematic encoder which may receive an input vector i and output a code word c. Encoder 1710 may further include a constraints transform module 1711, which may be used to find a translation between the input of the basic encoder 1713 and a product vector d. Encoder 1710 may further include a transition matrix module 1712 that may apply a transition matrix which may transform the product vector d to balance bits b. In embodiments, the basic encoder 1713 may receive the input vector i, which may have length $k_c$, as an input, and may encode the input vector in order to output the code word c, according to Equation 72 below:

$$c = ENC_0(i) \quad \text{Equation 72}$$

In embodiments, $ENC_0(i)$ may correspond to a GCC encoder, for example any of the GCC encoders discussed above. According to the H-GCC encoding scheme, a set of $L_c$ affine constraints may be imposed, in the form Equation 73 below, where $d \in \{0,1\}^{L_c}$:

$$P_c \cdot c = d_w \quad \text{(Equation 73)}$$

As shown in FIG. 17A, the constraints transform module 1711 may receive the input vector i as an input, and may apply a linear constraints transform in order to output a preliminary constraints vector d*, which may have length L. In embodiments, the constraints transform module 1911 may include the basic encoder 1713, which may encode the input vector i to obtain a preliminary code word cg. Then, the constraints transform module 1911 may multiply the preliminary code word $c_i$ by a constraints matrix $P_c$ to obtain the preliminary constraints vector d*.

In order to enforce the constraints, the input vector i may be expanded to include an additional Le number of bits, which may be the balance bits denoted b. For example, the input vector i used as input for the encoder 1710 may have a length $k_c$, and may include information bits in an information vector i', which may have a length $k_c - L_c$, and may further include the balance bits b, which may have a length $L_c$. In embodiments, the indexes set for the information bits in i may be referred to as set $\alpha$, such that $i_\alpha = i'$, and the indexes set for the balance bits in i may be referred to as set $\beta$, such that $i_\beta = b$, and $|\alpha \cap \beta| = 0$. Set $\beta$ locations in the indexes of i may be tailored to the specific problem, for example to the specific codes being used, and are not necessarily consecutive.

In embodiments, the balance bits may be used to make the output code word $c_{out}$ meet the demanded constraints. In order to determine the relationship between the balance bits b and the preliminary constraints vector d*, a transition matrix $T_c$ may be assembled. The transition matrix $T_c$ may be used to transform the standard basis $\{e_0, e_1, \ldots, e_{L-1}\}$, in which $e_{k,k}=1$ and $e_{k,j \neq k}=0$, to a basis that can be used in the encoder 1700A.

Figure 17B:
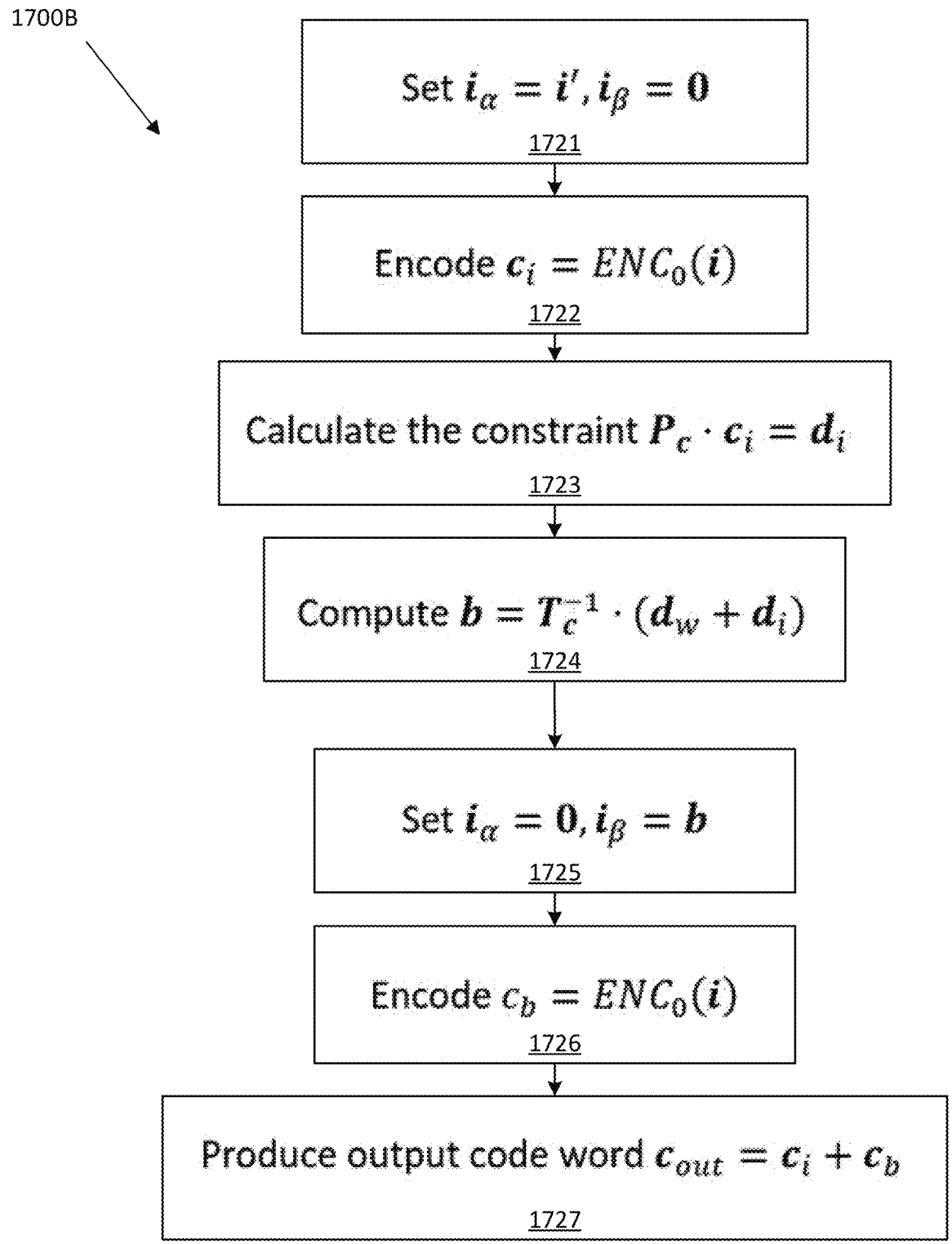
FIG. 17B is a flowchart of a process for constructing a transition matrix corresponding to FIG. 17A, according to embodiments.

FIG. 17B is a flowchart of a process 1700B for generating an output code word using the encoder 1700A, according to embodiments. Referring to FIGS. 17A and 17B, at operation 1721, the process 1700B may include placing the information vector i' into the input vector i, and setting the balance bits b to zero. At operation 1722, the process 1700B may include encoding the input vector i to obtain the preliminary code word $c_i$ using the basic encoder 1713. At operation 1723, the process 1700B may include computing the preliminary constraints vector $d_i$ using the constraints transform module 1711. At operation 1724, the process 1700B may include computing the balance bits b based on the preliminary constraints vector $d_i$ and the target constraints vector $d_w$ using the transition matrix module 1712. At operation 1725, the process 1700B may include updating the input vector i by placing the balance bits b into the input vector i, and setting the information vector i' to zero. At operation 1726, the process 1700B may include encoding the updated input vector i to obtain the preliminary code word $c_b$ using the basic encoder 1713. At operation 1727, the process 1700B may include generating the output code word $c_{out}$ by obtaining a sum of the preliminary code word $c_i$ and the preliminary code word $c_b$. In embodiments, the output code word $c_{out}$ may correspond to the H-GCC code word.

Figure 18A:
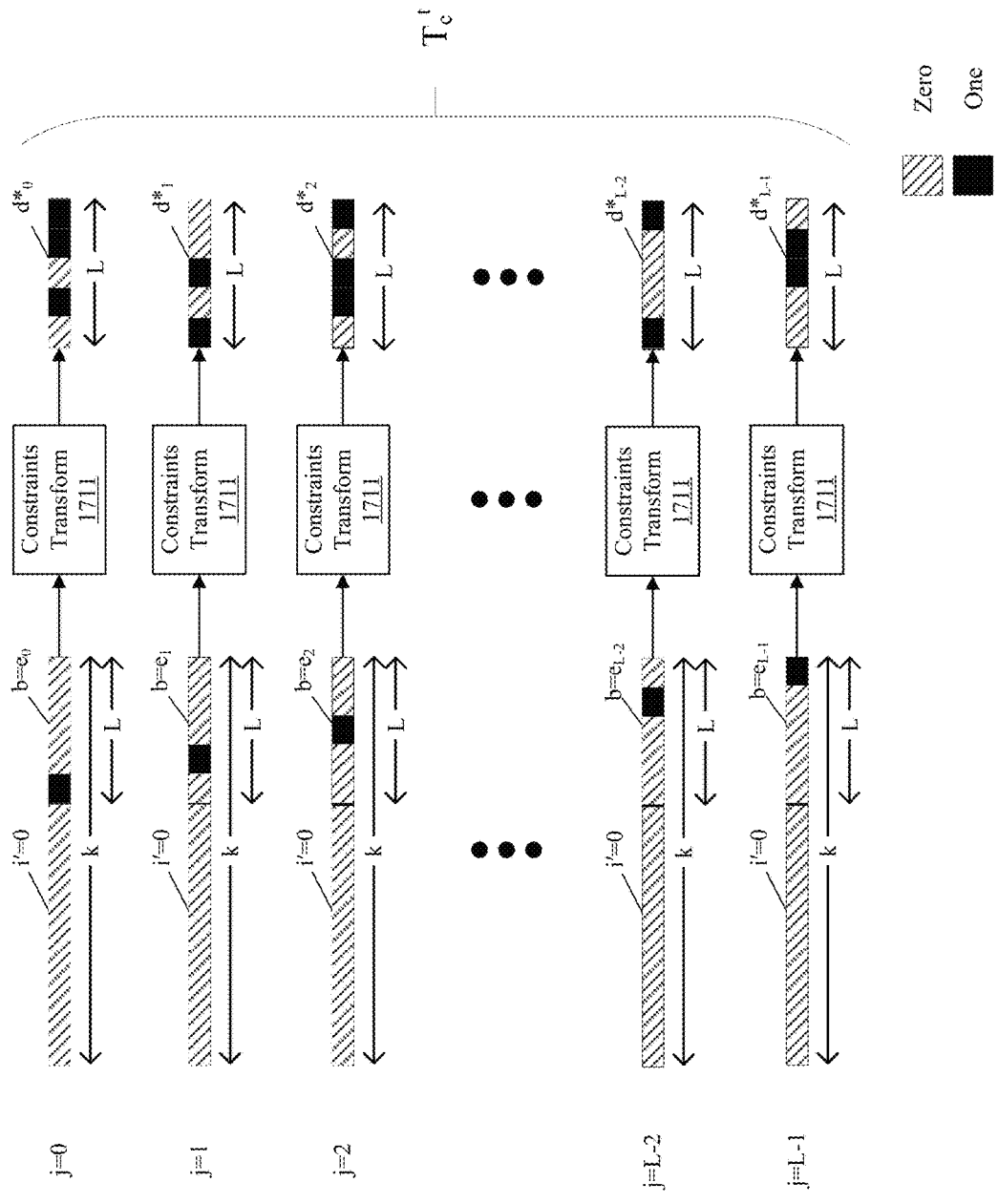
FIG. 18A is a block diagram of an encoder for encoding information bits to generate an output code word, according to embodiments.

FIG. 18A illustrates an example of a process for constructing a transition matrix $T_c$, according to embodiments. FIG. 18B is a flowchart of a process 1800B for constructing a transition matrix $T_c$ corresponding to FIG. 18A, according to embodiments. As shown in FIG. 18A, for each j from j=0 through j=L−1, a different input vector i is input into the constraints transform module 1711 described above to obtain a constraints vector $d_j^*$, and then the constraints vectors $d_j^*$ are assembled into the transition matrix $T_c$.

For example, at operation 1821, the process 1800 may include setting the balance bits b equal to the basis vector $e_j$. At operation 1822, the process 1800 may include placing the balance bits b in the input vector i, and setting the information vector i' of the input vector i to 0. At operation 1823, the process 1800 may include computing the constraints vector $d_j^*$ using the constraints transform module 1711. Then, at operation 1824, the process 1800 may include placing the constraints vector in the $j^{th}$ column of transition matrix $T_c$, which may be the $j^{th}$ row of an transposed transition matrix $T_c^t$. As illustrated in FIG. 17A, the balance bits b may be grouped and aligned on a right side of the input vector i, but embodiments are not limited thereto. For example, in embodiments the balance bits b may be interleaved anywhere in the input vector i.

In embodiments, the transition matrix $T_c$ may be used to manufacture any $L_c$ length vector with the balance bits b. For this to happen, the transition matrix $T_c$ may be fully ranked. If the transition matrix $T_c$ is not fully ranked, the set β may be changed. A b to d* transform is linear, and may be represented according to Equation 74 below:

$$d^* = T_c b \qquad \text{Equation 74}$$

Figure 18B:
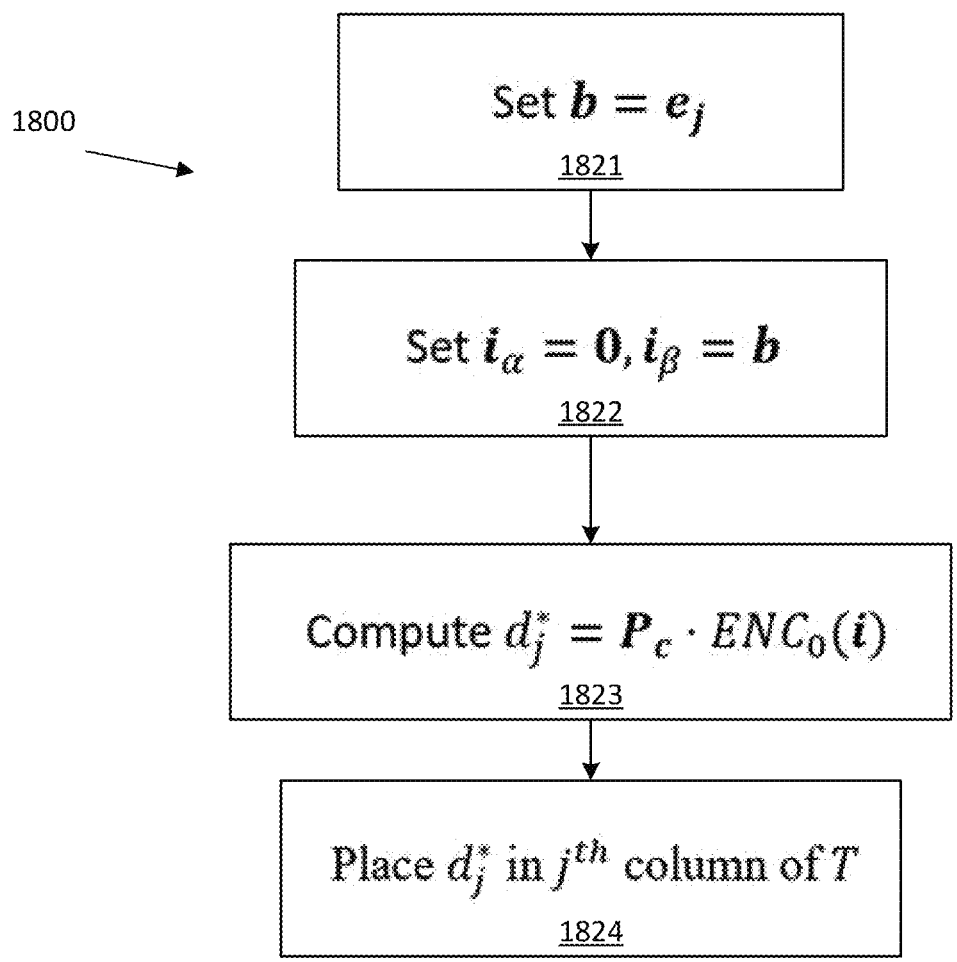
FIG. 18B is a flowchart of a process for generating an output code word using the encoder of FIG. 18A, according to embodiments.

The transition matrix $T_c$ computed according to FIGS. 18A and 18B may be invertible. As a result, for any constraints vector $\tilde{d}$, the balance bits $\tilde{b}$ which produce the constraints vector $\tilde{d}$ can be found according to Equation 75 below:

$$\tilde{b} = T_c^{-1} \tilde{d} \qquad \text{Equation 75}$$

FIGS. 19A to 20C relate to a second example H-GCC encoding process. In particular, according to FIGS. 19A to 20C, the second example H-GCC encoding may performed using a sequential encoder. In embodiments, the second example H-GCC encoding process may relate to the H-GCC code structure discussed above with respect to FIGS. 15-16.

According to the second example H-GCC encoding process, a constraint may be placed on the selection of additional parity bits $β_p$, according to Equation 76 and Equation 77 below:

$$|β_p| = P_G \qquad \text{(Equation 76)}$$

$$β_p \subseteq γ \qquad \text{(Equation 77)}$$

These constraints may allow the second example H-GCC encoding process to be performed using a sequential encoder.

The code word $c_i^p$ may have a local dimension $k_i$ and basic local overhead $n-k_i$. Additional global overhead bits $δ_i^p$ may be added, $\hat{k}_i^p = k_i - δ_i^p$ information bits may be generated, and the corresponding RS codes overhead $\hat{F}_t^p$ may be determined according to Equation 35 above.

The additional global overhead bits $δ_i^p$ may generate the corresponding additional overhead $Δ_t^p$, which may be represented according to Equation 78 below:

$$Δ_t^p = \hat{F}_t^p - F_t. \qquad \text{(Equation 78)}$$

For the S-RS codes, denoted as $W_t \in$ SRS $(L_2, D_t, L_1, F_t, [Q_{t,q}]_{q=1}^{D_t})$, the additional overhead $Δ_t^p$ may define $\hat{D}_t$ and $[\hat{Q}_{t,q}]_{q=1}^{\hat{D}_t}$ as discussed above with respect to S-RS codes.

The selection of the additional global overhead bits $δ_i^p$ may meet the following constraints. For example, the additional global overhead bits $δ_i^p$ may have a stairstep structure according to Equation 79 below:

$$k_i - δ_i^p \geq k_j - δ_j^p \quad \forall p \in [L_2], \forall i < j \qquad \text{(Equation 79)}$$

The additional global overhead bits $δ_i^p$ may satisfy a global parity budget according to Equation 80 below:

$$\sum_{i=1}^{L_2} δ_i^p = P_G \qquad \text{(Equation 80)}$$

The S-RS codes may satisfy Equation 81 and Equation 82 below:

$$\hat{D}_t = D_t \forall t \in [M_1] \qquad \text{(Equation 81)}$$

$$\{\hat{Q}_{t,1}, \hat{Q}_{t,2}, ..., \hat{Q}_{t,\hat{D}_t}\} = \{Q_{t,1}, Q_{t,2}, ..., Q_{t,D_t}\} \forall t \in [M_1] \qquad \text{(Equation 82)}$$

Equation 82 may be an equality between sets, meaning there may be a permutation $\hat{W}_t$, such that Equation 83 below is satisfied:

$$\hat{Q}_{t,\hat{W}_t(q)} = Q_{t,q}. \qquad \text{(Equation 83)}$$

Figure 19A:
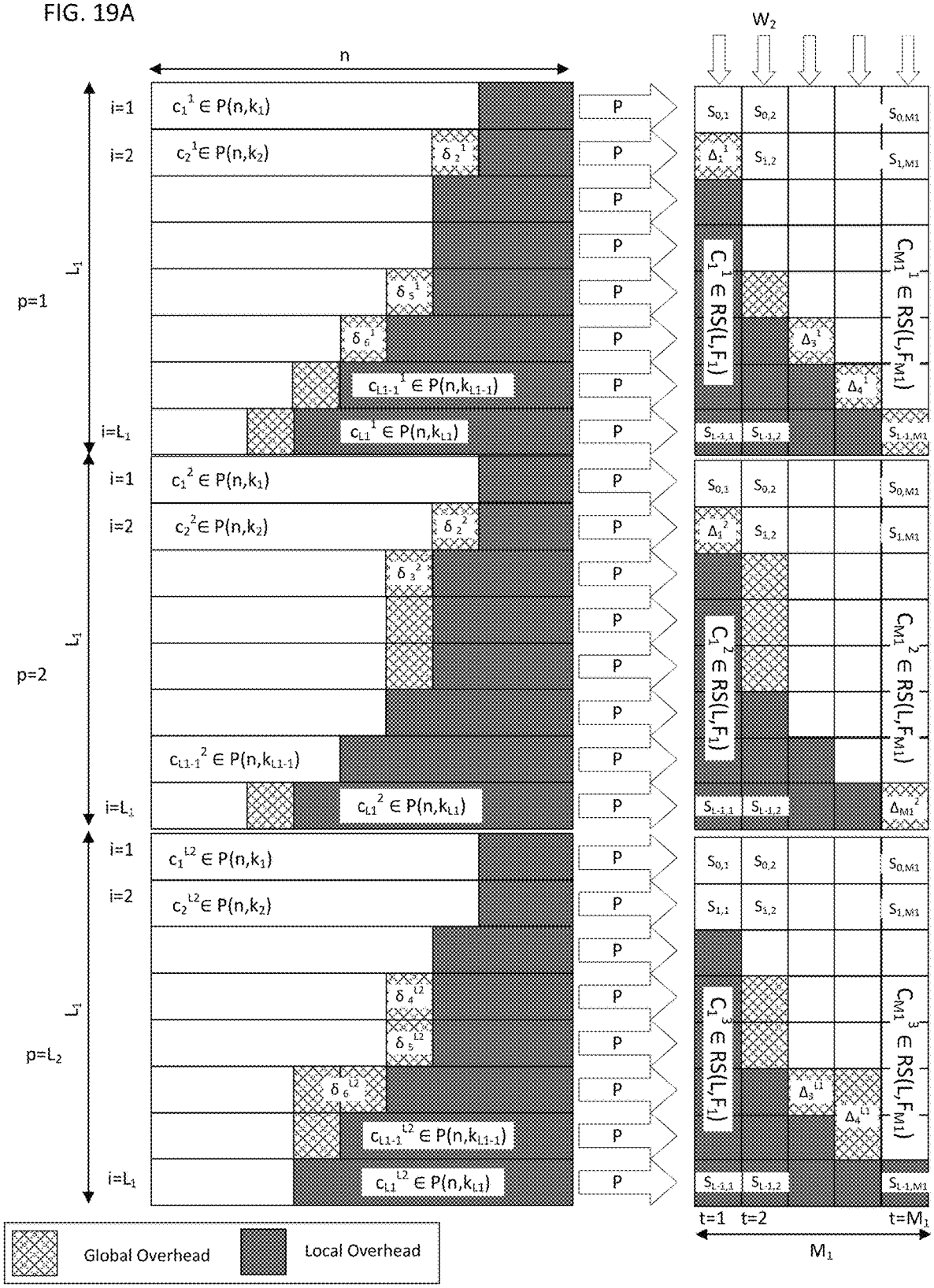
FIG. 19A illustrates an example of overhead allocation for an H-GCC code word, according to embodiments.

The permutation may be achieved also by permutating the S-RS rows, $\hat{p}=W_t(p)$, such that applying Equation 35 on $\hat{k}_i^β$ result in $[Q_{t,1}, Q_{t,2}, \ldots, Q_{t,D_t}]$ FIG. 19A illustrates an example of overhead allocation for the H-GCC code word corresponding to the second example H-GCC encoding process, according to embodiments. For example, in FIG. 19A, the S-RS code word for t=2, SRS $(L_2, D_t, L_1, F_t, [Q_{t,q}]_{q=1}^{D_t})$, may have $F_t=3$, $D_t=3$ and $\hat{Q}_{t,q=1,2,3} = [4,6,5]$. In embodiments, the S-RS for $t=M_2$ as shown in FIG. 21A may have $F_t=0$. In embodiments, the code structure illustrated in FIG. 19A may correspond to the code structure FIG. 15.

For the S-RS code t, a GCC systematic encoder may be applied, as discussed above with respect to FIGS. 12A to 12C. In embodiments, a permutation $W_t(p)$ may first be applied on the S-RS rows. The permutation followed by the GCC encoding and de-permutation may be denoted by "S-RS Encoder( )".

Figure 19B:
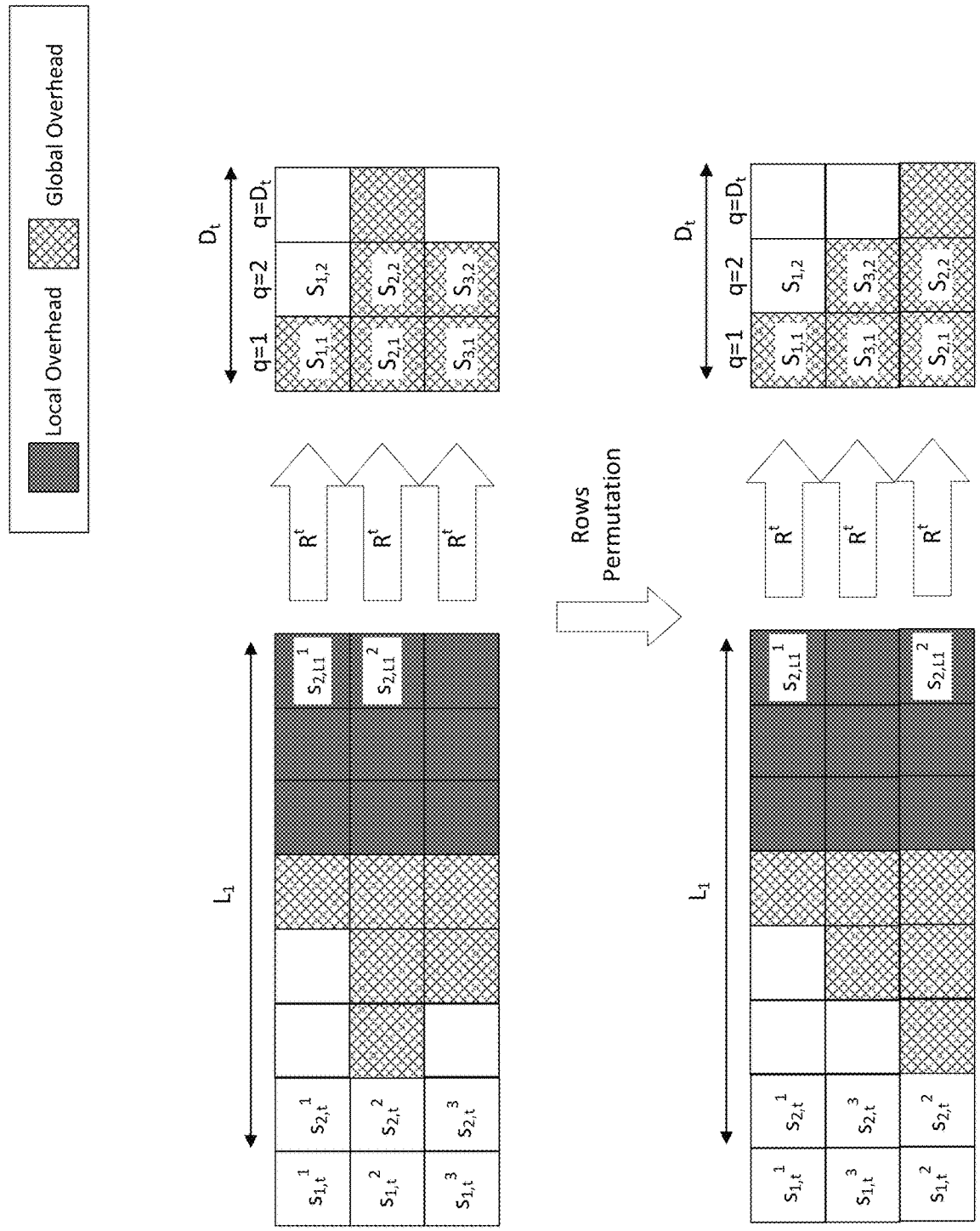
FIG. 19B illustrates an example of a row permutation which may be performed on S-RS code words, according to embodiments.

FIG. 19B illustrates an example of a row permutation which may be performed on the S-RS code words in order to use the S-RS code words in the sequential H-GCC encoder, according to embodiments. In particular, FIG. 19B shows the S-RS code word for t=2 from FIG. 19A, before and after a row permutation. As can be seen in FIG. 19B, the S-RS code word for t=2 may have a stair step structure after the row permutation, and therefore may be suitable for the sequential H-GCC encoder.

Figure 20B:
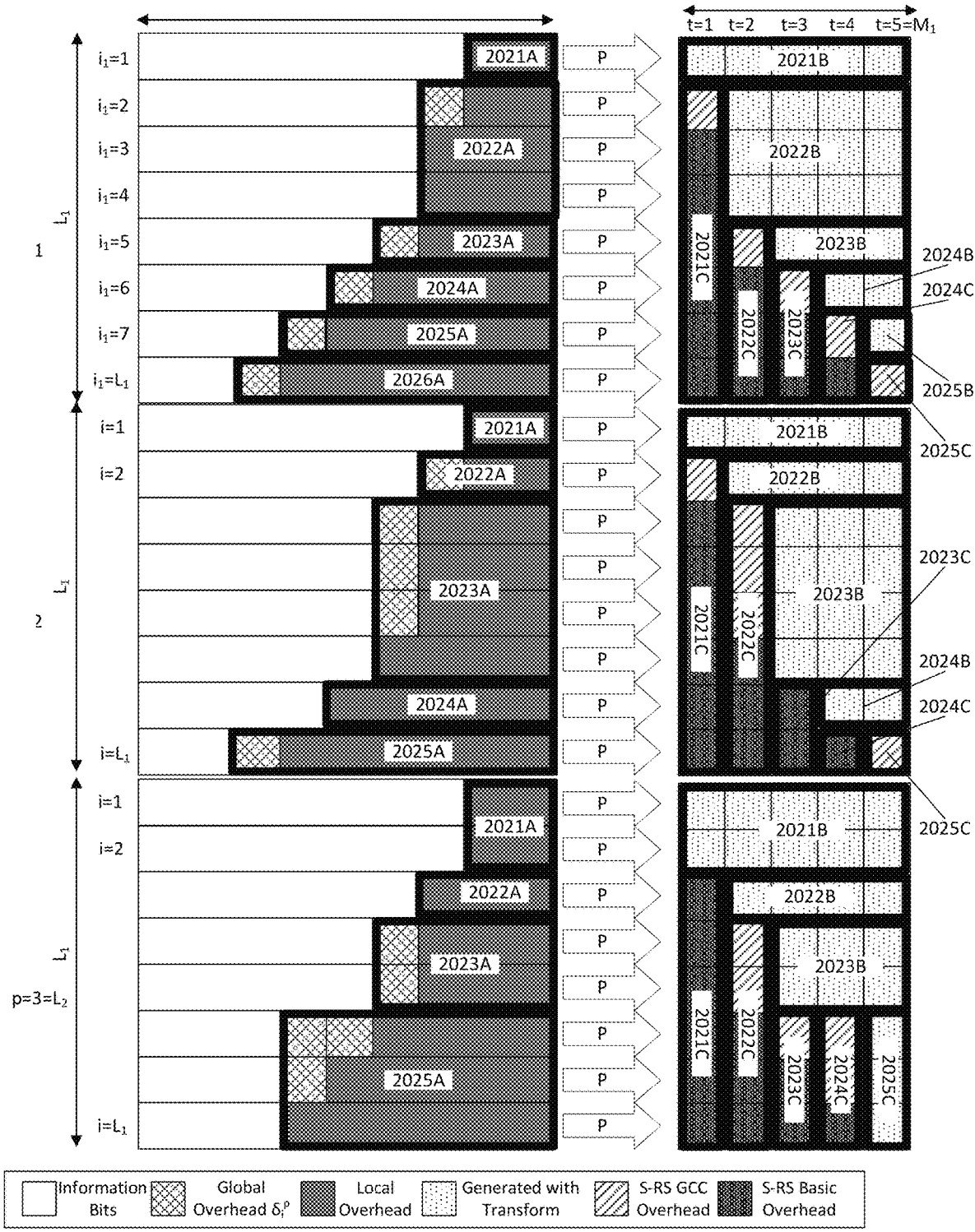
FIG. 20B illustrates an example encoding order, according to embodiments.

FIGS. 20A-20C relate to the second example H-GCC encoding process discussed above. According to embodiments, the second example H-GCC encoding process may be performed using a sequential encoder, which may be included in any element described above, for example the storage device 200 discussed above with respect to FIG. 2A, the ECC encoding circuit 510 discussed above with respect to FIG. 2B, or any other element.

FIG. 20A illustrates an example of a sequential encoding algorithm which may be used to perform H-GCC encoding, presented in pseudo-code as Algorithm 2. The sequential H-GCC encoder algorithm may include criss-cross activations of a coset polar encoder and an S-RS encoder. In embodiments, the coset polar encoder may be denoted in Algorithm 2 as "polar encoder( )". In embodiments, the coset polar encoder may correspond to Equation 44 discussed above.

FIG. 20B illustrates an example encoding order which may correspond to the sequential H-GCC encoder algorithm discussed above. As shown in FIG. 20B, at operation 2021A, local overhead bits for polar code words at $i_1$=[1], $i_2$=[1], $i_3$=[1,2] may be determined using a polar encoder. At operation 2021B, the transform space for the polar code words at $i_1$=[1], $i_2$=[1], $i_3$=[1,2] may be determined using a transform. At operation 2021C, overhead parity bits for the S-RS code word at t=1 may be determined using the S-RS encoder.

As further shown in FIG. 20B, at operation 2022A, local overhead bits for polar code words at $i_1$=[2,3,4], $i_2$=[2], $i_3$=[3] may be determined using the polar encoder. At operation 2022B, the transform space for the polar code words a t$i_1$=[2,3,4], $i_2$=[2], $i_3$=[3] may be determined using the transform. At operation 2022C, overhead parity bits for an S-RS code word at t=2 may be determined using the S-RS encoder.

As further shown in FIG. 20B, at operation 2023A, local overhead bits for polar code words at $i_1$=[5], $i_2$=[3,4,5,6], $i_3$=[4,5] may be determined using the polar encoder. At operation 2023B, the transform space for the polar code words at $i_1'_2$ [5], $i_2$=[3,4,5,6], is =[4,5] may be determined using the transform. At operation 2023C, overhead parity bits for an S-RS code word at t=3 may be determined using the S-RS encoder.

As further shown in FIG. 20B, at operation 2024A, local overhead bits for polar code words at $i_1$=[6], $i_2$=[7], $i_3$=[ ] may be determined using the polar encoder. At operation 2024B, the transform space for the polar code words at $i_1$=[6], $i_2$=[7], $i_3$=[ ] may be determined using the transform. At operation 2024C, overhead parity bits for an S-RS code word at t=4 may be determined using the S-RS encoder.

As further shown in FIG. 20B, at operation 2025A, local overhead bits for polar code words at $i_1$=[7], $i_2$=[ ], $i_3$=[6,7,8] may be determined using the polar encoder. At operation 2025B, the transform space for the polar code words at $i_1'_2$ [7], $i_2$=[ ], $i_3$=[6,7,8] may be determined using the transform. At operation 2025C, overhead parity bits for an S-RS code word at t=5 may be determined using the S-RS encoder.

As further shown in FIG. 20B, at operation 2026A, local overhead bits for polar code words at $i_1$=[8], $i_2$=[8], $i_3$=[ ] may be determined using the polar encoder.

According to embodiments, operations 2021A, 2022A, 2023A, 2024A, 2025A, and 2026A may correspond to "Step a" of Algorithm 2, operations 2021B, 2022B, 2023B, 2024B, and 2025B may correspond to "Step b" of Algorithm 2, and operations 2021C, 2022C, 2023C, and 2024C may correspond to "Step c" of Algorithm 2.

FIG. 20C is a flowchart of an encoding process, according to embodiments. For example, process 2000C as shown in FIG. 20C may correspond to some or all of Algorithm 2 discussed above. For example, at operation 2031, the process 2000C may include encoding a next polar code word for the current frame. At operation 2032, the process 2000C may include updating the transform space corresponding to the encoded polar code words. At operation 2033, the process 2000C may include determining whether the last frame has been reached. Based on determining that the last frame has not been reached (NO at operation 2033), the process 2000C may set the next frame as the current frame, and may return to operation 2031. Based on determining that the last frame has been reached (YES at operation 2033), the process 2000C may proceed to operation 2034.

At operation 2034, the process 2000C may include determining whether the last polar code words for each frame have been reached. Based on determining that the last polar code words have been reached (YES at operation 2034), the process 2000C may proceed to operation 2035, and output the H-GCC code word. Based on determining that the last polar code words have not been reached (NO at operation 2034), the process 2000C may proceed to operation 2036, which may include determining whether the next polar code words have a same degree as the polar code words encoded in operation 2031. Based on determining that the next polar code words do have the same degree (YES at operation 2036), the process 2000C may return to operation 2031. Based on determining that the next polar code words do not have the same degree (NO at operation 2036), the process 2000C may proceed to operation 2037.

At operation 2037, the process 2000C may include encoding a next S-RS code word. At operation 2038, the process 2000C may include determining whether the last S-RS code word has been reached. Based on determining that the last S-RS code word has been reached (YES at operation 2038), the process 2000C may proceed to operation 2039, which may include updating the polar code words based on results of encoding the S-RS code words, and then returning to operation 2031. Based on determining that the last S-RS code word has not been reached, the process 2000C may proceed to operation 2040, which may include determining whether the next RS code word has a same degree. Based on determining that the next S-RS code word does have the same degree (YES at operation 2039), the process 2000C may return to operation 2037. Based on determining that the next S-RS code word does not have the same degree (NO at operation 2039), the process 2000C may proceed to operation 2040.

According to embodiments, the H-GCC encoding processes discussed above may be performed using any element described herein, for example the storage device 200 discussed above with respect to FIG. 2A, the ECC encoding circuit 510 discussed above with respect to FIG. 2B, or any other element.

According to embodiments, the H-GCC code could instead be defined with a polar subcode as constituent code, or with BCH code as constituent code, and different systematic encoders may be used.

Figure 21:
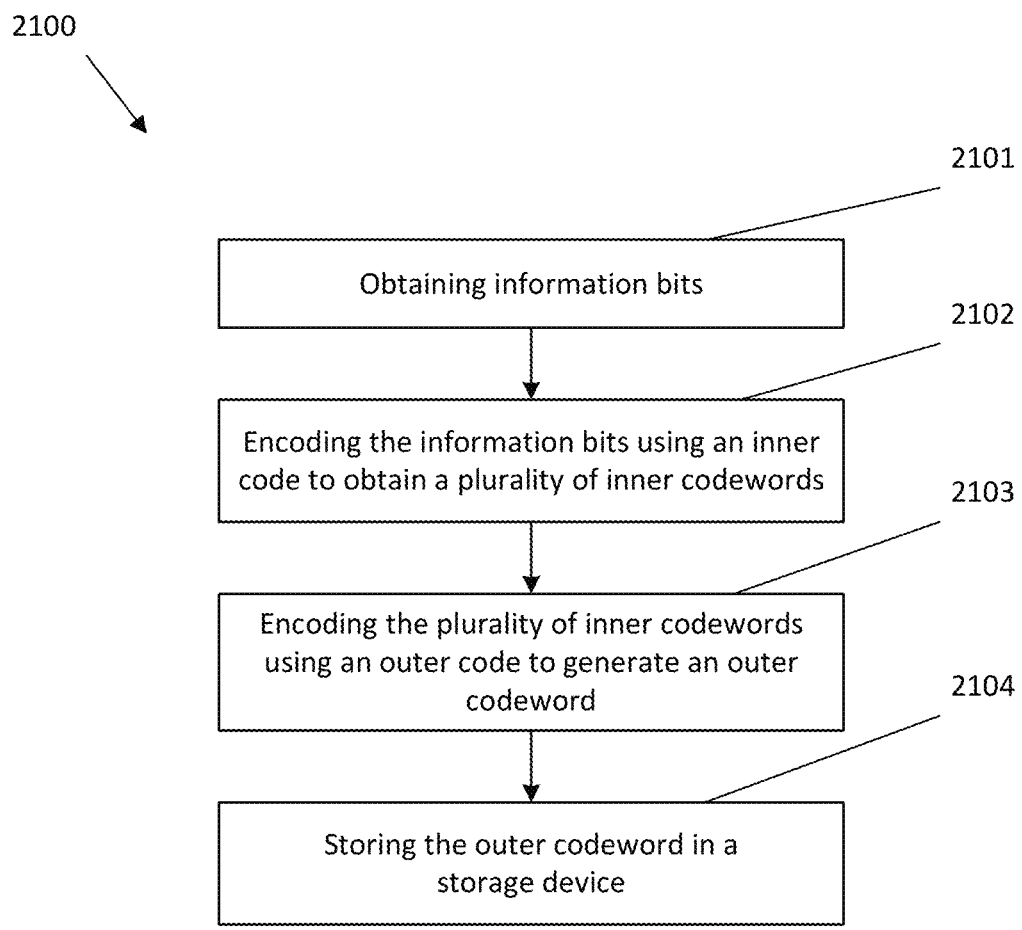
FIG. 21 is a flowchart of a process for controlling a storage system, according to embodiments.

FIG. 21 is a flowchart of a process 2100 of controlling a storage device, according to embodiments. In some implementations, one or more process blocks of FIG. 21 may be performed by any one or more of the encoders discussed above.

As shown in FIG. 21, at operation 2101 the process 2100 may include obtaining information bits.

As further shown in FIG. 21, at operation 2102 the process 2100 may include encoding the information bits using an inner code to obtain a plurality of inner code words.

As further shown in FIG. 21, at operation 2103 the process 2100 may include encoding the plurality of inner code words using an outer code to generate an outer code word.

In embodiments, at least one of the inner code and the outer code may include a generalized concatenated code (GCC), and the outer code word may include a hierarchical-GCC (H-GCC) code word.

As further shown in FIG. 21, at operation 2104 the process 2100 may include storing the outer code word in a storage device.

In embodiments, the H-GCC code word may include a plurality of frames, each frame of the plurality of frames has a same length, the each frame of the plurality of frames may include a same number of local parity bits generated based on the inner code, and the each frame of the plurality of frames may include a same number of global parity bits generated based on the outer code.

In embodiments, the each frame of the plurality of frames may be stored in a random access unit (RAU) included in the storage device.

In embodiments, the inner code may include the GCC, constituent codes of the inner code comprise a polar code and a first Reed-Solomon (RS) code, and the outer code may include a second RS code. In embodiments, this H-GCC code structure may correspond to FIGS. 13 and 14 discussed above.

In embodiments, the inner code may include a polar code, the outer code may include the GCC, and constituent codes of the outer code comprise a first Reed-Solomon (RS) code and a second RS code. In embodiments, this H-GCC code structure may correspond to FIG. 15 discussed above.

In embodiments, the outer code word may include a plurality of frames, and the encoding of the information bits may include: applying the polar code to the information bits to generate local parity bits; and placing the local parity bits in the plurality of inner code words, and the encoding of the plurality of inner code words may include: applying a first transform to the plurality of inner code words to generate a plurality of sets of symbols in a transform space, wherein each set of symbols from among the plurality of sets of symbols corresponds to an inner code word from among the plurality of inner code words; grouping the plurality of sets of symbols into the outer code word; applying the first RS code and the second RS code to the outer code word to generate global parity bits; and placing the global parity bits in the plurality of inner code words to generate the H-GCC code word. In embodiments, this H-GCC encoding process may correspond to FIGS. 19A to 20C discussed above.

In embodiments, the plurality of inner code words may include a first inner code word and second inner code word, the plurality of sets of symbols may include a first set of symbols generated based on the first inner code word, the first set may be used to generate at least one first global parity bit from among the global parity bits, and the at least one first global parity bit may be used to apply the polar code to the second inner code word. In embodiments, this H-GCC code structure may correspond to FIGS. 20A to 20C discussed above.

In embodiments, the first sets of symbols may be permutated before the first RS code and the second RS code are applied. In embodiments, this permutation may correspond to FIG. 19B discussed above.

Although FIG. 21 shows example blocks of process 2100, in some implementations, the process 2100 may include additional blocks, fewer blocks, different blocks, or differently arranged blocks than those depicted in FIG. 21. Additionally, or alternatively, two or more of the blocks of the process 2100 may be arranged or combined in any order, or performed in parallel.

Accordingly, embodiments may relate to an H-GCC hierarchical code family which may be expressed as a concatenation of GCC constituent codes with RS codes. The H-GCC code may correspond to $L_2$ GCC constituent code words $w_p \in GCC(L_1, M_1, n, n-k_0, \{F_t\}_{t=1}^{M_1}, P(n, k_{0 \to M_1}, \phi_0^{0 \to M_1})$ and transform $T_j = H_{F_i, F_i + d_i} \cdot P_t$, $j \in [M_2], t \in [M_1]$, $d_t \in [D_t]$, as well as parameters $\{D_t\}_{t=1}^{M_1}$, $(M_2 \triangleq \Sigma_{t=1}^{M_1} D_t)$ and mapping $M(t, d_t)$, and RS codes $W_j \in RS(L_2, Q_j)$, $j \in [M_2]$. In embodiments, the H-GCC code may have a length $L_2 \cdot N$ and a dimension $L_2 \cdot K$. The H-GCC code may include $L_2$ constituent codes $w_p$, each of length $N = L_1 \cdot n$, local overhead $P_L = \Sigma_{i=1}^{L_1}(n - k_i)$, and additional global overhead $$P_G = \frac{1}{L_2} \sum_{j=1}^{M_2} Q_j \cdot m.$$

An equivalent construction of the H-GCC code may relate to a set of S-RS code words $W_t \in SRS\ (L_2, D_t, L_1, F_t, [Q_{t,q}]_{q=1}^{D_t})$, $t \in [M_1]$. The parity check matrix of this code may be represented according to Equation 84 below:

$$H_{H-GCC} = \begin{bmatrix} H_P \\ H_L \\ H_G \end{bmatrix} = \begin{bmatrix} I_{L_1 \cdot L_2} \otimes P_0 \\ I_{L_2} \otimes \begin{bmatrix} H_{F_1} \cdot I_{L_1} \otimes P_1 \\ H_{F_2} \cdot I_{L_1} \otimes P_2 \\ \vdots \\ H_{F_{M_1}} \cdot I_{L_1} \otimes P_{M_1} \end{bmatrix} \\ \begin{bmatrix} H_{Q_1} \cdot I_{L_2} \otimes T_1 \\ H_{Q_2} \cdot I_{L_2} \otimes T_2 \\ \vdots \\ H_{Q_{M_2}} \cdot I_{L_2} \otimes T_{M_2} \end{bmatrix} \end{bmatrix} \quad \text{(Equation 84)}$$

Embodiments may also relate to a systematic encoder which may use a GCC sequential encoder to generate $P_L$ local parity bits, for each of the GCC codes $w_p \in GCC(L_1, M_1, n, n-k_0, \{F_t\}_{t=1}^{M_1}, P(n, k_{0 \to M_1}, \phi_0^{0 \to M_1}))$. To meet the global constraints equations, balanced bits location, $\beta_p$, are selected and a constraint generator matrix $T_c$ is generated.

Embodiments may also relate to a systematic sequential encoder, which includes a criss-cross activation of a polar coset encoder and an S-RS encoder. The S-RS encoder may use a permutation on the RS rows in order to enable the sequential encoder.

Figure 22:
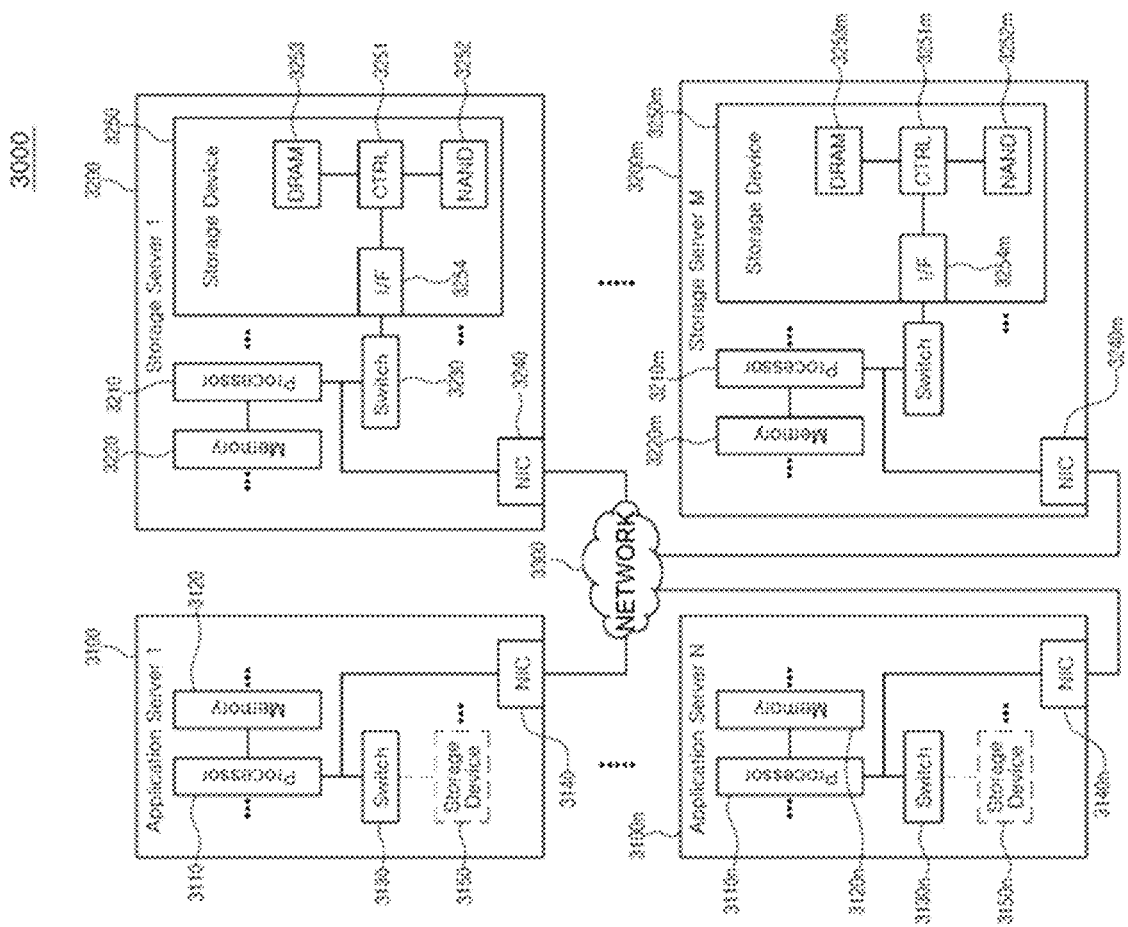
FIG. 22 is a block diagram of data center, according to embodiments.

FIG. 22 is a diagram of a data center 3000 to which a memory device is applied, according to embodiments.

Referring to FIG. 22, the data center 3000 may be a facility that collects various types of pieces of data and provides services and be referred to as a data storage center.

The data center 3000 may be a system for operating a search engine and a database, and may be a computing system used by companies, such as banks, or government agencies. The data center 3000 may include application servers 3100 to 3100$n$ and storage servers 3200 to 3200$m$. The number of application servers 3100 to 3100$n$ and the number of storage servers 3200 to 3200$m$ may be variously selected according to embodiments. The number of application servers 3100 to 3100$n$ may be different from the number of storage servers 3200 to 3200$m$.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100$n$ may communicate with the storage servers 3200 to 3200$m$ through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200$m$ may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCoE), network attached storage (NAS), and NVMe over Fabrics (NVMe-oF).

Hereinafter, the application server 3100 and the storage server 3200 will mainly be described. A description of the application server 3100 may be applied to another application server 3100$n$, and a description of the storage server 3200 may be applied to another storage server 3200$m$.

The application server 3100 may store data, which is requested by a user or a client to be stored, in one of the storage servers 3200 to 3200$m$ through the network 3300. Also, the application server 3100 may obtain data, which is requested by the user or the client to be read, from one of the storage servers 3200 to 3200$m$ through the network 3300. For example, the application server 3100 may be implemented as a web server or a database management system (DBMS).

The application server 3100 may access a memory 3120$n$ or a storage device 3150$n$, which is included in another application server 3100$n$, through the network 3300. Alternatively, the application server 3100 may access memories 3220 to 3220$m$ or storage devices 3250 to 3250$m$, which are included in the storage servers 3200 to 3200$m$, through the network 3300. Thus, the application server 3100 may perform various operations on data stored in application servers 3100 to 3100$n$ and/or the storage servers 3200 to 3200$m$. For example, the application server 3100 may execute an instruction for moving or copying data between the application servers 3100 to 3100$n$ and/or the storage servers 3200 to 3200$m$. In this case, the data may be moved from the storage devices 3250 to 3250$m$ of the storage servers 3200 to 3200$m$ to the memories 3120 to 3120$n$ of the application servers 3100 to 3100$n$ directly or through the memories 3220 to 3220$m$ of the storage servers 3200 to 3200$m$. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC(Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200$m$ or the application servers 3100 to 3100$n$, a processor may transmit a command to storage devices 3150 to 3150$n$ and 3250 to 3250$m$ or the memories 3120 to 3120$n$ and 3220 to 3220$m$ and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150$n$ and 3250 to 3250$m$ may transmit a control signal and a command/address signal to NAND flash memory devices 3252 to 3252$m$ in response to a read command received from the processor. Thus, when data is read from the NAND flash memory devices 3252 to 3252m, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210m of another storage server 3200m, or the processors 3110 and 3110n of the application servers 3100 and 3100n. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although a few example embodiments have been described, those skilled in the art will readily appreciate that many modifications are possible in the embodiments without materially departing from the present scope.

What is claimed is:

1. A storage system, comprising:
a storage device configured to store a plurality of code words; and
at least one processor configured to:
obtain information bits;
encode the information bits using an inner code to obtain a plurality of inner code words;
encode the plurality of inner code words using an outer code to generate an outer code word; and
store the outer code word in the storage device,
wherein at least one of the inner code and the outer code comprises a generalized concatenated code (GCC),
wherein the outer code word comprises a hierarchical-GCC (H-GCC) code word,
wherein the H-GCC code word comprises a plurality of frames,
wherein each frame of the plurality of frames has a same length,
wherein the each frame of the plurality of frames includes a same number of local parity bits generated based on the inner code, and
wherein the each frame of the plurality of frames includes a same number of global parity bits generated based on the outer code.

2. The storage system of claim 1, wherein the each frame of the plurality of frames is stored in a corresponding random access unit (RAU) included in the storage device.

3. The storage system of claim 1, wherein the inner code comprises the GCC,
wherein constituent codes of the inner code comprise a polar code and a first Reed-Solomon (RS) code, and
wherein the outer code comprises a second RS code.

4. The storage system of claim 1, wherein the inner code comprises a polar code,
wherein the outer code comprises the GCC, and
wherein constituent codes of the outer code comprise a first Reed-Solomon (RS) code and a second RS code.

5. The storage system of claim 4,
wherein to encode the information bits, the at least one processor is further configured to:
apply the polar code to the information bits to generate the local parity bits; and
place the local parity bits in the plurality of inner code words, and
wherein to encode the plurality of inner code words, the at least one processor is further configured to:
apply a first transform to the plurality of inner code words to generate a plurality of sets of symbols in a transform space, wherein each set of symbols from among the plurality of sets of symbols corresponds to an inner code word from among the plurality of inner code words;
group the plurality of sets of symbols into the outer code word;
apply the first RS code and the second RS code to the outer code word to generate the global parity bits; and
place the global parity bits in the plurality of inner code words to generate the H-GCC code word.

6. The storage system of claim 5, wherein the plurality of inner code words comprises a first inner code word and second inner code word,
wherein the plurality of sets of symbols comprise a first set of symbols generated based on the first inner code word,
wherein the first set of symbols is used to generate at least one first global parity bit from among the global parity bits, and
wherein the at least one first global parity bit is used to apply the polar code to the second inner code word.

7. The storage system of claim 5, wherein the plurality of sets of symbols are permutated before the first RS code and the second RS code are applied.

8. A device for encoding information bits for storage in a storage device, the device comprising:
a memory interface configured to communicate with the storage device; and
at least one processor configured to:
obtain the information bits;
encode the information bits using a polar code to obtain a plurality of polar code words;
encode the plurality of polar code words using a generalized concatenated code (GCC) to obtain a hierarchical-GCC (H-GCC) code word, wherein constituent codes of the GCC comprise a first Reed-Solomon (RS) code and a second RS code; and
control the memory interface to transmit the H-GCC code word to the storage device,
wherein the H-GCC code word comprises a plurality of frames,
wherein each frame of the plurality of frames has a same length,
wherein the each frame of the plurality of frames includes a same number of local parity bits generated based on the polar code, and
wherein the each frame of the plurality of frames includes a same number of global parity bits generated based on the GCC.

9. The device of claim 8, wherein the each frame of the plurality of frames is stored in a corresponding random access unit (RAU) included in the storage device.

10. The device of claim 8,
wherein to encode the information bits, the at least one processor is further configured to:
apply the polar code to the information bits to generate the local parity bits; and
place the local parity bits in the plurality of polar code words, and
wherein to encode the plurality of polar code words, the at least one processor is further configured to:
apply a transform to the plurality of polar code words to generate a plurality of sets of symbols in a transform space, wherein each set of symbols from among the plurality of sets of symbols corresponds to a polar code word from among the plurality of polar code words;
group the plurality of sets of symbols;
apply the first RS code and the second RS code to the grouped plurality of sets of symbols to generate the global parity bits; and
place the global parity bits in the plurality of polar code words to generate the H-GCC code word.

11. The device of claim 10, wherein the plurality of polar code words comprises a first polar code word and second polar code word,
wherein the plurality of sets of symbols comprise a first set of symbols generated based on the first polar code word,
wherein the first set of symbols is used to generate at least one first global parity bit from among the global parity bits, and wherein the at least one first global parity bit is used to apply the polar code to the second polar code word.

12. The device of claim 10, wherein the plurality of sets of symbols are permutated before the first RS code and the second RS code are applied.

13. A method of controlling a storage system, the method being executed by at least one processor and comprising:
obtaining information bits;
encoding the information bits using an inner code to obtain a plurality of inner code words;
encoding the plurality of inner code words using an outer code to generate an outer code word; and
storing the outer code word in a storage device,
wherein at least one of the inner code and the outer code comprises a generalized concatenated code (GCC),
wherein the outer code word comprises a hierarchical-GCC (H-GCC) code word,
wherein the H-GCC code word comprises a plurality of frames,
wherein each frame of the plurality of frames has a same length,
wherein the each frame of the plurality of frames includes a same number of local parity bits generated based on the inner code, and
wherein the each frame of the plurality of frames includes a same number of global parity bits generated based on the outer code.

14. The method of claim 13, wherein the each frame of the plurality of frames is stored in a random access unit (RAU) included in the storage device.

15. The method of claim 13, wherein the inner code comprises the GCC,
wherein constituent codes of the inner code comprise a polar code and a first Reed-Solomon (RS) code, and
wherein the outer code comprises a second RS code.

16. The method of claim 13, wherein the inner code comprises a polar code,
wherein the outer code comprises the GCC, and
wherein constituent codes of the outer code comprise a first Reed-Solomon (RS) code and a second RS code.

17. The method of claim 16,
wherein the encoding of the information bits comprises:
applying the polar code to the information bits to generate the local parity bits; and
placing the local parity bits in the plurality of inner code words, and
wherein the encoding of the plurality of inner code words comprises:
applying a first transform to the plurality of inner code words to generate a plurality of sets of symbols in a transform space, wherein each set of symbols from among the plurality of sets of symbols corresponds to an inner code word from among the plurality of inner code words;
grouping the plurality of sets of symbols into the outer code word;
applying the first RS code and the second RS code to the outer code word to generate the global parity bits; and
placing the global parity bits in the plurality of inner code words to generate the H-GCC code word.

* * * * *